(12) United States Patent
Zebian et al.

(10) Patent No.: US 9,091,183 B2
(45) Date of Patent: Jul. 28, 2015

(54) DOUBLE PINCH CRITERION FOR OPTIMIZATION OF REGENERATIVE RANKINE CYCLES

(75) Inventors: Hussam Zebian, Cambridge, MA (US); Alexander Mitsos, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 306 days.

(21) Appl. No.: 13/475,816

(22) Filed: May 18, 2012

(65) Prior Publication Data

US 2012/0291435 A1 Nov. 22, 2012

Related U.S. Application Data

(60) Provisional application No. 61/488,371, filed on May 20, 2011.

(51) Int. Cl.
*F01K 7/34* (2006.01)
*F01K 27/00* (2006.01)
(Continued)

(52) U.S. Cl.
CPC . *F01K 13/02* (2013.01); *F01K 7/22* (2013.01); *F01K 7/40* (2013.01); *F01K 17/06* (2013.01); *F22D 1/325* (2013.01); *F01K 7/24* (2013.01); *F01K 25/08* (2013.01); *Y02E 20/18* (2013.01)

(58) Field of Classification Search
CPC ......... F01K 7/40; F01K 21/00; F01K 21/047; F01K 23/04; F01K 13/02; F01K 17/06; F01K 19/04; F22D 1/325; F23C 6/02; F23C 99/001; F23C 99/003; Y02E 20/16

USPC ............ 60/39.01, 39.19, 39.55, 39.181, 653, 60/670, 775, 643, 645, 671; 237/12, 12.1
See application file for complete search history.

(56) References Cited

U.S. PATENT DOCUMENTS 4,841,721 A * 6/1989 Patton et al. ............... 60/39.181
6,035,643 A * 3/2000 Rosenblatt ..................... 60/671
(Continued)

FOREIGN PATENT DOCUMENTS

WO    WO 2004065763 A2 *  8/2004

OTHER PUBLICATIONS

Extended European Search Report in corresponding European App. No. 12789604.1 dated Jun. 15, 2015 (7 pages).
(Continued)

*Primary Examiner* — Christopher Jetton
*Assistant Examiner* — Daniel Wagnitz
(74) *Attorney, Agent, or Firm* — Thomas J. Engellenner; Reza Mollaaghababa; Pepper Hamilton LLP

(57) ABSTRACT

Systems and methods are disclosed herein that generally involve a double pinch criterion for optimization of regenerative Rankine cycles. In some embodiments, operating variables such as bleed extraction pressure and bleed flow rate are selected such that a double pinch is obtained in a feedwater heater, thereby improving the efficiency of the Rankine cycle. In particular, a first pinch point is obtained at the onset of condensation of the bleed and a second pinch point is obtained at the exit of the bleed from the feedwater heater. The minimal approach temperature at the first pinch point can be approximately equal to the minimal approach temperature at the second pinch point. Systems that employ regenerative Rankine cycles, methods of operating such systems, and methods of optimizing the operation of such systems are disclosed herein in connection with the double pinch criterion.

14 Claims, 11 Drawing Sheets

(51) Int. Cl.
*F01K 13/00* (2006.01)
*F01K 13/02* (2006.01)
*F01K 7/22* (2006.01)
*F01K 7/40* (2006.01)
*F01K 17/06* (2006.01)
*F22D 1/32* (2006.01)
*F01K 25/08* (2006.01)
*F01K 7/24* (2006.01)

(56) References Cited

U.S. PATENT DOCUMENTS

| | | | |
|---|---|---|---|
| 7,040,095 | B1 | 5/2006 | Lang |
| 7,325,400 | B2 | 2/2008 | Cunningham et al. |
| 8,091,361 | B1 | 1/2012 | Lang |
| 2004/0238654 | A1* | 12/2004 | Hagen et al. ............. 237/12.1 |
| 2006/0254251 | A1* | 11/2006 | Yamada ..................... 60/39.19 |
| 2009/0071166 | A1* | 3/2009 | Hagen et al. ................ 60/775 |
| 2009/0125152 | A1* | 5/2009 | Skowronski et al. ......... 60/670 |

OTHER PUBLICATIONS

Farhad S. et al: "Efficient design of feedwater heaters network in steam power plants using pinch technology and exergy analysis", International Journal of Energy Research, vol. 32, No. 1, Jan. 2008, pp. 1-11.

Linnhoff B. et al: "Integration of a new process into an existing site: A case study in the application of pinch technology", Journal of Engineering for gas turbines and power, vol. 113, Apr. 1, 1991, pp. 159-169.

Zebian, H. et al: "A double-pinch criterion for regenerative Rankine cycles", Energy, vol. 40, No. 1, Jan. 31, 2012, pp. 258-270.

* cited by examiner

DOUBLE PINCH CRITERION FOR OPTIMIZATION OF REGENERATIVE RANKINE CYCLES

CROSS-REFERENCE TO RELATED APPLICATIONS

This application claims priority to U.S. Provisional Patent Application No. 61/488,371 filed on May 20, 2011 and entitled "A Double Pinch Criterion For Optimization Of Regenerative Rankine Cycles: Powerplant Operation and Simulation/Optimization." The entire contents of this provisional application are incorporated herein.

FIELD

In some embodiments, the present invention relates to systems that employ regenerative Rankine cycles, methods of operating such systems, and methods of optimizing the operation of such systems. In particular, the present invention relates to a double pinch criterion for optimization of regenerative Rankine cycles.

BACKGROUND

The well-known Rankine cycle and its various derivatives (e.g., Kalina cycles or organic Rankine cycles) are used in approximately 80% of worldwide electricity production. Rankine cycles can be used with a wide array of energy sources, including fossil fuels, nuclear, geothermal, solar, and bio-fuels. The demand for electric energy is constantly increasing, and therefore so to is the use of Rankine cycles.

In a basic Rankine cycle, a working fluid such as water is pumped into a boiler where it is heated by an external heat source to produce a vapor. The high pressure vapor is routed to a turbine where it expands to rotate the turbine and produce output power. The pressure and temperature of the vapor decrease as it expands through the turbine. The vapor then exits the turbine and enters a condenser where it is condensed back into a saturated liquid. This liquid "feed" is then pumped back to the boiler and the cycle repeats.

Most Rankine cycles include one or more additional features to increase efficiency. For example, in a regenerative Rankine cycle, the feed returning from the condenser is preheated before being fed to the boiler. The feed is preheated in a feedwater heater (FWH) using a bleed stream of hot vapor from elsewhere in the system, e.g., from the turbine. While the bleed introduces slight losses in turbine output, the gains from preheating the feed produce a net increase in efficiency.

Rankine cycles have been around for a long time, and their design and operation have been extensively studied to the point that their operation is considered near optimum. Even a small increase in efficiency of these cycles, especially under practical and realistic operating conditions, can result in major economic and environmental advantages. Accordingly, a need exists for Rankine cycles having improved efficiency.

SUMMARY

Systems and methods are disclosed herein that generally involve a double pinch criterion for optimization of regenerative Rankine cycles. In some embodiments, operating variables such as bleed extraction pressure and bleed flow rate are selected such that a double pinch is obtained in a feedwater heater, thereby improving the efficiency of the Rankine cycle. In particular, a first pinch point is obtained at the onset of condensation of the bleed and a second pinch point is obtained at the exit of the bleed from the feedwater heater. The minimal approach temperature at the first pinch point can be approximately equal to the minimal approach temperature at the second pinch point. Systems that employ regenerative Rankine cycles, methods of operating such systems, and methods of optimizing the operation of such systems are disclosed herein in connection with the double pinch criterion.

In some embodiments, the invention can be implemented via simulation software whereby a global optimum of the regeneration sections of a Rankine cycle can be obtained without the need for spatial discretization.

In one aspect, a method of operating a power generation system is provided that includes heating a working fluid in a steam generator and directing the heated working fluid into a turbine to rotate the turbine, the working fluid forming a feed after exiting the turbine. The method also includes extracting a bleed from the turbine and using the bleed to heat the feed (e.g., after it exits a condenser, after it exits a deaerator, or after it exits an upstream feedwater heater). The feed is heated in a feedwater heater configured to exchange heat between a first flow path through which the feed flows and a second flow path through which the bleed flows. The method also includes adjusting at least one of the mass flow rate of the bleed and the extraction pressure of the bleed such that a double pinch is obtained in the feedwater heater.

The method can include adjusting at least one of the mass flow rate of the bleed and the extraction pressure of the bleed such that the temperature of the bleed exiting the feedwater heater is approximately equal to the temperature of the feed entering the feedwater heater. The method can include heating the feed in the steam generator after it exits the feedwater heater. The feed can be formed by condensing the working fluid in a condenser after the working fluid exits the turbine. The steam generator can be a supercritical steam generator and the heated working fluid can be in a supercritical state. The steam generator can be a subcritical boiler and the heated working fluid can be a superheated vapor. The double pinch can include a first pinch point at the onset of condensation of the bleed and a second pinch point at the exit of the bleed from the feedwater heater. The minimal approach temperature at the first pinch point can be approximately equal to the minimal approach temperature at the second pinch point. The extraction pressure of the bleed ($P_B$) and the mass flow rate of the bleed ($\dot{m}_B$) selected for a given feedwater heater heat duty transfer ($\dot{Q}$) can be approximated by:

$$\dot{m}_B = \dot{m}_F \frac{h^{g,sat}(P_B) - h^l(T_{F,i} + \Delta_{MITA}T, P_B)}{h^l(T^{sat}(P_B) - \Delta_{MITA}T, P_F) - h^l(T_{F,i}, P_F)}$$

and $$\dot{Q} = \dot{m}_B(h_T(P_B) - h(T_{F,i} + \Delta_{MITA}T, P_B)).$$

Selecting the extraction pressure of the bleed ($P_B$) and the mass flow rate of the bleed ($\dot{m}_B$) in such a way can avoid the need for discretization for numerical computations, or can avoid the need to check for pinch points during actual operation. The smallest extraction pressure that allows for a pinch at bleed outlet of the feedwater heater can be selected as the extraction pressure of the bleed. The smallest mass flow rate that allows for a pinch at the onset of bleed phase change can be selected as the mass flow rate of the bleed. Adjusting the mass flow rate of the bleed can include opening or closing a valve. Adjusting the extraction pressure of the bleed can include adjusting a valve network to select a location in the turbine from which the bleed is extracted. The turbine can include a plurality of turbine stages and the valve network can be configured to select from which of the plurality of stages the bleed is extracted. The method can also include, during transient modes of power plant operation, adjusting at least one of the mass flow rate of the bleed and the extraction pressure of the bleed such that a double pinch is obtained in the feedwater heater. Transient modes of power plant operation can include power plant startup.

In another aspect, a method of designing a power generation system is provided. The method includes, using a processor, receiving a plurality of input design parameters and storing the input design parameters in a memory coupled to the processor. The method also includes, using the processor, based on the received input design parameters, calculating an output design parameter comprising at least one of a bleed extraction pressure and a bleed mass flow rate for a feedwater heater, the feedwater heater being configured to preheat a feed of working fluid using a bleed extracted from a turbine. The method also includes outputting the calculated output design parameter. The output design parameter is calculated to produce a double pinch in the feedwater heater.

In some embodiments, the input design parameters include at least one of a flow rate of a main stream through the turbine, a steam generator temperature, a steam generator pressure, and a condenser operating pressure. The method can also include constructing a power generation system according to the output design parameter. The double pinch can include a first pinch point at the onset of condensation of the bleed and a second pinch point at the exit of the bleed from the feedwater heater. The minimal approach temperature at the first pinch point can be approximately equal to the minimal approach temperature at the second pinch point. The output design parameter can include an extraction pressure of the bleed ($P_B$) and a mass flow rate of the bleed ($\dot{m}_B$) which are approximately calculated for a given feedwater heater heat duty transfer ($\dot{Q}$) by:

$$\dot{m}_B = \dot{m}_F \frac{h^{g,sat}(P_B) - h^l(T_{F,i} + \Delta_{MITA}T, P_B)}{h^l(T^{sat}(P_B) - \Delta_{MITA}T, P_F) - h^l(T_{F,i}, P_F)}$$

and $\dot{Q} = \dot{m}_B(h_T(P_B) - h(T_{F,i} + \Delta_{MITA}T, P_B))$.

The output design parameter can include an extraction pressure of the bleed calculated as the smallest extraction pressure that allows for a pinch at bleed outlet of the feedwater heater. The output design parameter can include a mass flow rate of the bleed calculated as the smallest mass flow rate that allows for a pinch at the onset of bleed phase change. The output design parameter can be determined by an iterative calculation and a double pinch criterion can be imposed during each iteration of the calculation.

In another aspect, a power generation system is provided that includes a steam generator in which a working fluid is heated, and a turbine in fluid communication with the steam generator and configured to be turned by the heated working fluid, the working fluid forming a feed after exiting the turbine. The system also includes at least one feedwater heater configured to heat the feed using a bleed extracted from the turbine, the feedwater heater being configured to exchange heat between a first flow path through which the feed flows and a second flow path through which the bleed flows. At least one of the mass flow rate of the bleed and the extraction pressure of the bleed is selected such that the temperature of the bleed exiting the feedwater heater is approximately equal to the temperature of the feed entering the feedwater heater such that a double pinch is obtained in the feedwater heater.

In some embodiments, the feed can be heated in the steam generator after it exits the feedwater heater. The feed can be formed by condensing the working fluid in a condenser after it exits the turbine. The steam generator can be a supercritical steam generator and the heated working fluid can be in a supercritical state. The steam generator can be a subcritical boiler and the heated working fluid can be a superheated vapor. The double pinch can include a first pinch point at the onset of condensation of the bleed and a second pinch point at the exit of the bleed from the feedwater heater. The minimal approach temperature at the first pinch point can be approximately equal to the minimal approach temperature at the second pinch point. The minimal approach temperature at the first pinch point and the minimal approach temperature at the second pinch point can be within about 5 degrees C. of one another. The bleed can exit the feedwater heater as a subcooled liquid. The bleed can be extracted from the turbine as a superheated vapor or a two-phase fluid. The working fluid can include at least one of water, heptane, toluene, isobutane, and ammonia.

The extraction pressure of the bleed ($P_B$) and the mass flow rate of the bleed ($\dot{m}_B$) selected for a given feedwater heater heat duty transfer ($\dot{Q}$) can be approximated by:

$$\dot{m}_B = \dot{m}_F \frac{h^{g,sat}(P_B) - h^l(T_{F,i} + \Delta_{MITA}T, P_B)}{h^l(T^{sat}(P_B) - \Delta_{MITA}T, P_F) - h^l(T_{F,i}, P_F)}$$

and $\dot{Q} = \dot{m}_B(h_T(P_B) - h(T_{F,i} + \Delta_{MITA}T, P_B))$.

The smallest extraction pressure that allows for a pinch at bleed outlet of the feedwater heater can be selected as the extraction pressure of the bleed. The smallest mass flow rate that allows for a pinch at the onset of bleed phase change can be selected as the mass flow rate of the bleed. The system can include a valve configured to adjust the mass flow rate of the bleed. The system can include a valve network for adjusting the location in the turbine from which the bleed is extracted to adjust the extraction pressure of the bleed. The turbine can include a plurality of turbine stages and the valve network can be configured to select from which of the plurality of stages the bleed is extracted.

In another aspect, a power generation system is provided that includes a steam generator in which a working fluid is heated, and a turbine in fluid communication with the steam generator and configured to be turned by the heated working fluid, the working fluid forming a feed after exiting the turbine. The system also includes at least one feedwater heater configured to heat the feed using a bleed extracted from the turbine. At least one of the extraction pressure of the bleed ($P_B$) and the mass flow rate of the bleed ($\dot{m}_B$) selected for a given feedwater heater heat duty transfer ($\dot{Q}$) is approximated by:

$$\dot{m}_B = \dot{m}_F \frac{h^{g,sat}(P_B) - h^l(T_{F,i} + \Delta_{MITA}T, P_B)}{h^l(T^{sat}(P_B) - \Delta_{MITA}T, P_F) - h^l(T_{F,i}, P_F)}$$

and $\dot{Q} = \dot{m}_B(h_T(P_B) - h(T_{F,i} + \Delta_{MITA}T, P_B))$ such that a double pinch is obtained in the feedwater heater.

In another aspect, a power generation system is provided that includes a regenerative Rankine cycle in which at least one feedwater heater uses a bleed to preheat a feed of working fluid before the working fluid is heated in a steam generator.

A first pinch point is obtained in the feedwater heater at the onset of condensation of the bleed and a second pinch point is obtained in the feedwater heater at the exit of the bleed from the feedwater heater. The steam generator can be a supercritical steam generator configured to heat the working fluid to a supercritical state.

The present invention further provides devices, systems, and methods as claimed.

BRIEF DESCRIPTION OF THE DRAWINGS

The invention will be more fully understood from the following detailed description taken in conjunction with the accompanying drawings, in which.

DETAILED DESCRIPTION

Systems and methods are disclosed herein that generally involve a double pinch criterion for optimization of regenerative Rankine cycles. In some embodiments, operating variables such as bleed extraction pressure and bleed flow rate are selected such that a double pinch is obtained in a feedwater heater, thereby improving the efficiency of the Rankine cycle. In particular, a first pinch point is obtained at the onset of condensation of the bleed and a second pinch point is obtained at the exit of the bleed from the feedwater heater. The minimal approach temperature at the first pinch point can be approximately equal to the minimal approach temperature at the second pinch point. Systems that employ regenerative Rankine cycles, methods of operating such systems, and methods of optimizing the operation of such systems are disclosed herein in connection with the double pinch criterion.

Certain exemplary embodiments will now be described to provide an overall understanding of the principles of the structure, function, manufacture, and use of the systems and methods disclosed herein. One or more examples of these embodiments are illustrated in the accompanying drawings. Those skilled in the art will understand that the systems and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
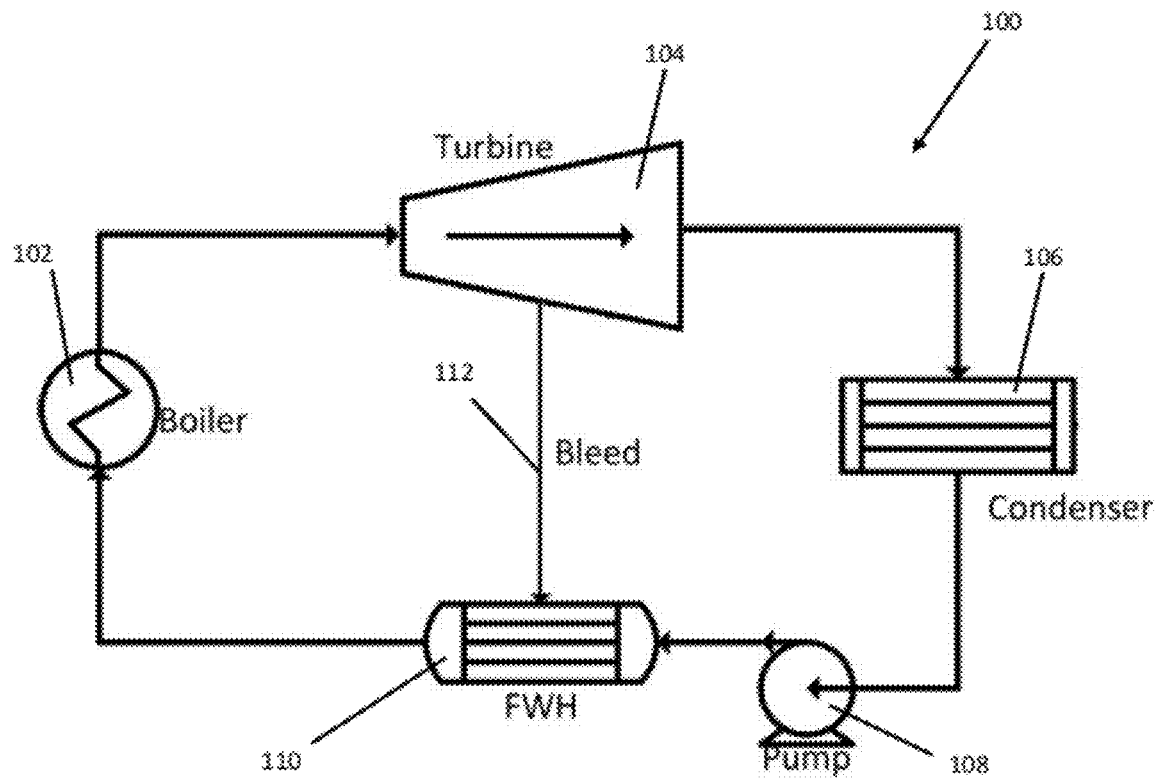
FIG. 1 is a schematic diagram of a power generation system that employs a regenerative Rankine cycle.

FIG. 1 illustrates one exemplary embodiment of a power generation system 100 that employs a regenerative Rankine cycle. The cycle can be subcritical or supercritical. As shown, the system 100 includes a steam generator 102, a turbine 104, a condenser 106, a pump 108, and a feedwater heater (FWH) 110.

The steam generator 102 includes a heat source and a substantially closed vessel in which a working fluid is heated by the heat source. Exemplary heat sources include geothermal systems, nuclear systems, gas or coal-fired burners, and so forth. Any of a variety of working fluids can be used with the system, such as water, ammonia, heptanes, toluene, isobutane, or combinations thereof. The steam generator 102 can be or can include a subcritical boiler or a supercritical steam generator.

The turbine 104 includes a rotor assembly having a shaft with one or more turbine blades attached thereto. As superheated vapor produced in the steam generator 102 flows through the turbine 104, it expands and acts on the blades to rotate the shaft, thereby generating useful work. An output shaft of the turbine 104 can be coupled to an electric generator such that electricity is produced as the turbine 104 rotates.

As working fluid exits the turbine 104, it flows into the condenser 106 where it is cooled by a heat exchanger. A cooling fluid is supplied to the heat exchanger to cool the fluid exiting the turbine 104, causing it to condense as a subcooled liquid. Any of a variety of cooling fluids can be used in the condenser 106, such as ambient air, water, etc.

The subcooled liquid exiting the condenser 106 is supplied via the mechanical pump 108 to the feedwater heater 110. The feedwater heater 110 can also be supplied with fluid exiting a deaerator, upstream feedwater heater, or other component intermediate to the feedwater heater 110 and the condenser 106. The feedwater heater 110 includes a heat exchanger that transfers heat from a bleed 112 tapped from the turbine 104 to the subcooled liquid feed exiting the condenser 106. The feedwater heater 110 thus performs the regeneration function of the system 100 by preheating the feed before it is supplied back to the steam generator 102 to continue the cycle.

While only a single steam generator, turbine, condenser, bleed, and feedwater heater are shown and described with respect to FIG. 1, this is merely for the sake of brevity, and the system 100 can include any number of such components. Also, while the term "feedwater" is used to describe various components of the system 100, it will be appreciated that the feed can be or can include working fluids other than water, as noted above.

It will also be appreciated that the system 100 can include various valves, ducts, pipes, sensors, controllers, and so forth to facilitate monitoring and adjustment of various operating parameters of the system 100. For example, an adjustable valve can be positioned in the bleed stream 112 to adjust the flow rate of the bleed 112 entering the feedwater heater 110. The system 100 can also include a network of valves, conduits, etc. which can be adjusted to select the location in the system 100 from which the bleed 112 is extracted. This can allow the extraction pressure to be varied, for example by extracting the bleed 112 from different stages of the turbine 104.

Figure 2:
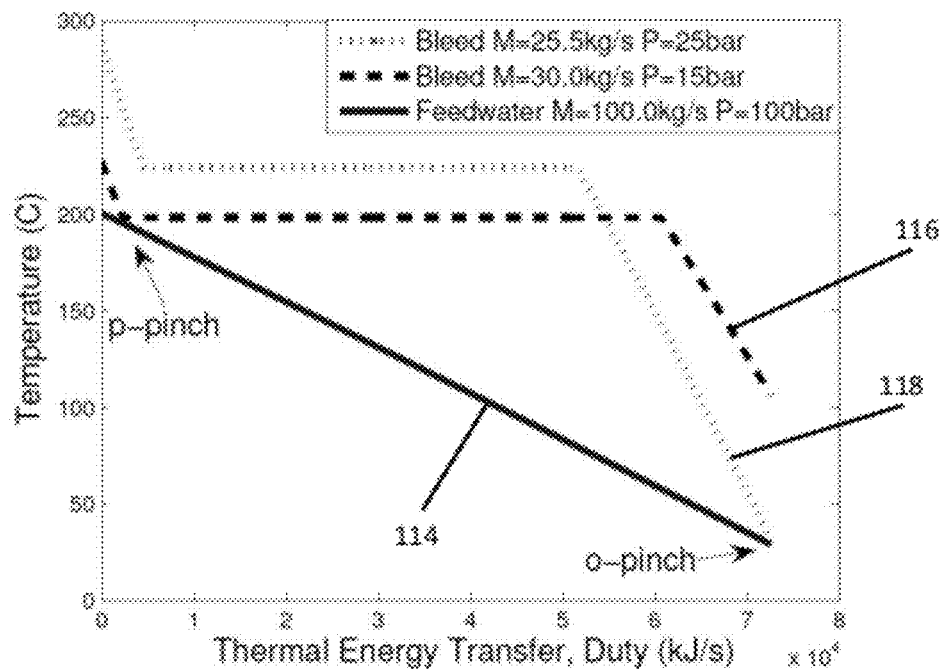
FIG. 2 is a pinch diagram for a feedwater heater.

FIG. 2 is a pinch diagram for the feedwater heater 110 in which temperature is plotted as a function of thermal energy transfer rate. As shown, there are two possible points at which a pinch can occur. The solid line 114 represents the feedwater at a mass flow rate M of 100.0 kg/s and a pressure P of 100 bar. The dashed line 116 represents the bleed at a mass flow rate M of 30.0 kg/s and a pressure P of 15 bar. The dotted line 118 represents the bleed at a mass flow rate M of 25.5 kg/s and a pressure P of 25 bar.

Because the feedwater is a subcooled liquid, the feedwater temperature rises according to a smooth curve between the inlet of the heat exchanger (the right-hand side of the pinch diagram) and the outlet of the heat exchanger (the left-hand side of the pinch diagram). The bleed enters the heat exchanger as a superheated vapor and changes phase to a subcooled liquid before exiting the heat exchanger. Accordingly, the bleed has a superheated region during which the temperature of the bleed decreases along a smooth curve. The bleed also has a condensation region during which the bleed temperature remains substantially constant. Once the bleed has fully condensed into a subcooled liquid, the bleed temperature again decreases according to a smooth curve in a subcooled region.

The region of condensation results in a horizontal line for the bleed, i.e., enthalpy decrease without temperature change. If it is assumed that the capacity rate of the feed is higher than that of the bleed for both the superheated and subcooled regions, then the other two curves corresponding to the bleed have a higher slope than the slope of the curve corresponding to the feed. Therefore, in the direction of flow of the bleed from the inlet to the outlet, the superheated and subcooled regions result in convergence between the bleed and the feed curves, whereas in the condensation region, divergence between the two curves is observed.

There are thus only two possible places where a pinch point, or a point at which the temperature difference between the feedwater and the bleed is at a minimum, can occur when a pure substance is used as the working fluid. One possible pinch point, the "p-pinch" can exist at the onset of bleed condensation. A second possible pinch point, the "o-pinch" can exist at the cold end of the heat exchanger (e.g., where the bleed exits the feedwater heater). If the bleed inlet is in the two-phase region, the onset of condensation coincides with the inlet.

The rate at which the bleed temperature decreases during both the superheated vapor and subcooled liquid stages can be adjusted by adjusting the mass flow rate of the bleed. (It takes a longer time to cool the bleed when more bleed fluid mass is entering the heat exchanger).

In addition, the temperature at which the bleed enters the heat exchanger, and the temperature at which the bleed begins condensing, can be adjusted by adjusting the pressure of the bleed. (At higher pressures, the bleed enters the heat exchanger at a higher temperature and begins to condense at a higher temperature).

Thus, even if the area of the heat exchanger and the mass flow rate and pressure of the feedwater entering the heat exchanger are fixed, it is possible to adjust the temperature difference between the bleed and the feedwater by adjusting the mass flow rate and/or pressure of the bleed.

In conventional power generation systems, the operating parameters are selected to minimize the p-pinch. That is, the pressure and/or flow rate of the bleed is adjusted so that the temperature at which the bleed begins to condense in the heat exchanger is approximately equal or very close to the temperature of the feedwater at that point. This is illustrated in FIG. 2 by the dashed line 116, which shows that the bleed mass flow rate M can be increased while the bleed pressure P is reduced to obtain a very small p-pinch. When this is done, the temperature difference between the bleed and the feedwater at the cold end of the heat exchanger (the potential place where an o-pinch can occur) becomes large. In other words, in conventional systems, the p-pinch is minimized, and no effort is made to obtain an o-pinch, much less to minimize the o-pinch.

The dotted line 118 in FIG. 2 illustrates how the operating parameters of a power generation system can be selected to minimize the o-pinch. As shown, the bleed mass flow rate M can be decreased while the bleed pressure P is increased to obtain a very small o-pinch. When this is done, the temperature difference between the bleed and the feedwater at the onset of bleed condensation (the potential place where a p-pinch can occur) becomes large. The conventional wisdom is that this arrangement is undesirable and inefficient.

In some embodiments of the present disclosure, the bleed mass flow rate M and/or the pressure P can be adjusted to minimize the temperature difference between the bleed and the feedwater at both the p-pinch point and the o-pinch point. Preferably, one or both of these parameters are adjusted such that the temperature difference between the bleed and the feedwater at the p-pinch is nearly the same as the temperature difference at the o-pinch. In some embodiments, the temperature difference at the p-pinch can be equal to the temperature difference at the o-pinch. In some embodiments, the difference between the p-pinch minimum approach temperature and the o-pinch minimum approach temperature can be less than about 20 degrees C., less than about 15 degrees C., less than about 10 degrees C., less than about 5 degrees C., less than about 3 degrees C., and/or less than about 1 degree C.

Figure 3:
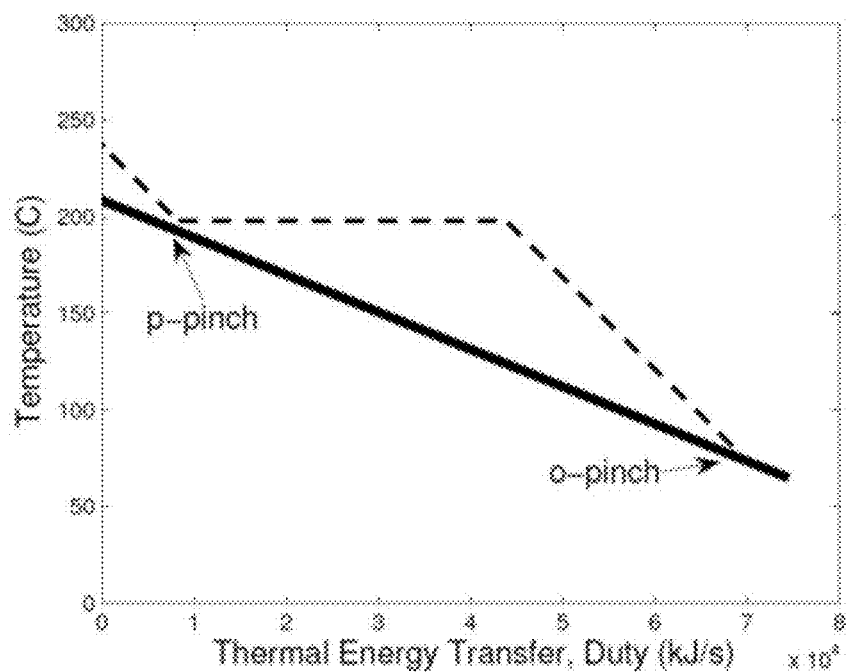
FIG. 3 is a pinch diagram for a feedwater heater in which a double pinch is obtained.

FIG. 3 is a pinch diagram for the feedwater heater 110 when a double pinch is obtained in which temperature is plotted as a function of thermal energy transfer rate. As shown, both the p-pinch and the o-pinch are minimized. As noted above, the conventional wisdom is that subcooling the bleed drain (as required for a double pinch) is a waste because the bleed exiting the feedwater heater 110 is generally used to feed one or more cascaded downstream feedwater heaters. The disclosure below demonstrates, however, that subcooling the bleed drain to obtain a double pinch unexpectedly produces greater operating efficiencies.

A double pinch criterion for closed feedwater heaters (FWH) of regenerative Rankine cycles is discussed in detail below. The FWHs are modeled as counter-current heat exchangers. Thus, as noted above, two potential pinch positions in the FWH exist: (1) at the exit of the bleed (drain) and (2) at the onset of bleed condensation. For a given heat duty in the FWH, feed inlet temperature and flowrate, the extraction flowrate and/or pressure can be chosen to achieve the same minimal approach temperature at the two potential pinch points and thereby optimize the efficiency of the cycle. An analytical proof is given below for a fixed pinch value for the case that the drain enters the condenser, based on weak assumptions. Additionally, the criterion is numerically demonstrated for fixed pinch value and for fixed heat exchanger area using the most common configurations: drain to condenser, drain to deaerator, and drain cascaded to next FWH. A similar criterion is developed below for the case that the drain is pumped (upwards or downwards) and mixed with the feedwater. The double pinch criterion disclosed herein simplifies the optimization procedure and results in significant efficiency increase for fixed heat exchanger area. For numerical and computational reasons, pressure can be used as the optimization variable and heat duty and mass flowrate can be calculated.

Nomenclature

| | Latin symbols | | |
|---|---|---|---|
| $P_B$ | Bleed pressure [bar] | $\dot{m}c_p$ | Capacity rate [kW/K] |
| $\left(\frac{\partial \dot{m}_B}{\partial P_B}\right)_o$ | Derivative of the extraction mass flowrate following pinch at the bleed outlet with respect to extraction pressure [kg/(s bar)] | $\left(\frac{\partial \dot{m}_B}{\partial P_B}\right)_p$ | Derivative of the extraction mass flowrate following pinch at the onset of condensation with-respect to extraction pressure [kg/(s bar)] |
| $h_T(P_o)$ | Enthalpy at the turbine outlet [kJ/kg] | $h_{B,o}$ | Enthalpy of the bleed stream in the outlet of the feedwater heater [kJ/kg] |
| $h^{g,sat}$ | Enthalpy of the saturated vapor [kJ/kg] | A | Heat Transfer Area [m$^2$] |
| U | Heat Transfer Coefficient [kW/(m$^2$ K)] | $\dot{m}$ | Mass flowrate [kg/s] |
| $P_o$ | Outlet pressure of the turbine | P | Pressure [bar] |
| $\dot{S}_{gen}$ | Rate of entropy generation [kW/K] | $\dot{Q}$ | Regenerated Duty [kW, MW] |
| $c_P^l$ | Specific liquid thermal capacity [kJ/(kg K)] | T | Temperature [C, K] |
| $\dot{W}_B$ | Power that the extraction stream would have generated in the turbine [kW] | | |
| | Greek symbols | | |
| η | Cycle Efficiency (%) | | |
| | Acronyms | | |
| CFWH | Closed Feed Water Heater | FWH | Feed Water Heater |
| HX | Heat Exchanger | MITA | Minimum Internal Temperature Approach [C, K] |
| OFWH | Open Feed Water Heater | o-pinch | Pinch at bleed exit from FWH |
| p-pinch | Pinch at onset of bleed condensation | | |
| | Subscripts | | |
| B | Bleed | B, i | Bleed in |
| B, o | Bleed out | F | Feed |
| F, i | Feed in | F, o | Feed out |
| o | Following o-pinch | p | Following p-pinch |
| T | Turbine expansion line | | |
| | Superscripts | | |
| g | Vapor | l | Liquid |
| lg | Evaporation | sat | Saturated state |

Rankine cycles are widely used in power generation, typically with features for efficiency increase such as reheat, super heat, and regeneration. Additional information on Rankine cycles can be found in A. Bejan, Thermal Design & Optimization, John Wiley & Sons, Inc., 1996; R. W. Haywood, Analysis of Engineering Cycles, 3rd Edition, Elsevier, 1980; and M. J. Moran, H. N. Shapiro, Fundamentals of Engineering Thermodynamics, 6th Edition, John Wiley and Sons, 2007, the entire contents of each of which are incorporated herein. Commercial software packages capable of high fidelity modeling of the power cycles are available, e.g., THERMOFLEX, ASPENPLUS, and GATECYCLE. These software packages offer tools for performing parametric and optimization studies on given cycles (flowsheet connectivity) or can construct power cycles for a given application.

All but the simplest cycles are regenerative, i.e., they include preheating of the feed (return from the condenser) via extraction of bleed streams from the turbine. This preheating is performed in closed and/or open feedwater heaters (CFWH and OFWH). There are various configurations of FWHs depending on where the exit bleed of the CFWH, i.e., the drain, is sent. The performance of the power cycle increases in general with the number of FWHs. Thus, typically the number of FWHs is selected based on cost considerations, i.e., balancing capital and operating costs. A well known approximate design criterion is to have an equal enthalpy rise across each FWH in the regeneration section of the Rankine cycle. More precisely, under some idealizations, for maximum efficiency in a non-reheat non-supercritical plant, the enthalpy rise of the feedwater up to the point of saturation should, to a first approximation, be the same in all heaters and the economizer.

CFWHs are essentially multi-phase heat exchangers (HX). The design of HX networks is a well-established field, additional details on which can be found in: L. T. Biegler, I. E. Grossmann, A. W. Westerberg, Systematic Methods of Chemical Process Design, Prentice Hall, N.J., 1997; J. Cerda, A. W. Westerberg, D. Mason, B. Linnhoff, Minimum utility usage in heat-exchanger network synthesis. A transportation problem, Chemical Engineering Science 38 (3) (1983) 373-387; J. Cerda, A. W. Westerburg, Synthesizing heat-exchanger networks having restricted stream stream matches using transportation problem formulations, Chemical Engineering Science 38 (10) (1983) 1723-1740; B. Linnhoff, E. Hindmarsh, The pinch design method for heat-exchanger networks, Chemical Engineering Science 38 (5) (1983) 745-763; S. A. Papoulias, I. E. Grossmann, A structural optimization approach in process synthesis 2. Heat-recovery networks, Computers & Chemical Engineering 7 (6) (1983) 707-721; and I. C. Kemp, Pinch Analysis and Process Integration, 2nd Edition, Elsevier, 2007, the entire contents of each of which are incorporated herein. The design of both power cycles and HX networks can be performed with either shortcut methods or more rigorous models. A very common shortcut method is the so-called pinch analysis, i.e., to select a minimal temperature approach (MITA) and then calculate the inlet conditions and heat duty for each HX. This shortcut has the advantage of decoupling the capital costs and detailed design of the HXs from the operating costs. The implicit assumption of the pinch method is that the required HX area is accurately characterized by the MITA. However, accurate calculation of heat transfer area is needed for economic optimization.

A new criterion is disclosed herein for the optimization of regenerative power cycles. In the discussion that follows, the criterion is applied to both pinch method and optimization for a fixed heat transfer area. CFWHs are generally treated herein as counter-current HXs. Consequently, there are two possible pinch points, namely at the onset of condensation and at the exit of the bleed (the drain). The main result herein is that for most FWH configurations, optimal operation is obtained by simultaneously achieving both pinches. In some embodiments, it is assumed that the connectivity between units (flowsheet) and the expansion line (condenser temperature, turbine inlet pressure and temperature, and total flowrate) are kept fixed. In some embodiments, the working fluid is assumed to be a pure species with phase change.

In a typical pinch analysis, a MITA is selected using economic criteria as a surrogate for HX area. Subsequently, there are three degrees of freedom for each CFWH, namely heat duty (as a surrogate via the MITA), bleed extraction pressure (and thus temperature), and bleed extraction flowrate. Thus, at least in principle, the cycle performance can be optimized numerically considering simultaneous variation of these degrees of freedom, subject to the constraints of minimal approach temperature. In the rigorous analysis, heat transfer area is selected via economic analysis, the remaining degrees of freedom are bleed extraction pressure and bleed extraction flowrate, and the MITA is free. The double-pinch design criterion disclosed herein eliminates two of the variables for each CFWH. Moreover, for the case of the pinch analysis, the criterion disclosed herein eliminates the need to check for the pinch-violation constraints and as such the need for a spatially distributed model for the feedwater heater. In summary, the systems and methods disclosed herein simplify the cycle optimization drastically. This computational acceleration is particularly important when Rankine cycles are not considered in isolation, but rather as a part of a complicated process, e.g., oxycombustion, or inside another procedure, e.g., selection of working fluid in an organic Rankine cycle. Additional details on oxycombustion processes can be found in H. Zebian, A. Mitsos, Multi-variable optimization of pressurized oxy-coal combustion, In Press: Energy (EGY) http://dx.doi.org/10.1016/j.energy.2011.12.043, 2011, the entire contents of which are incorporated herein.

Optimization of a Rankine cycle in isolation can be performed using general-purpose modeling tools. In the absence of the criteria disclosed herein, however, such "optimizations" actually result in suboptimal local optima. The systems and methods disclosed herein enable a simpler use of approximate design criteria, such as the aforementioned equal enthalpy rise across feedwater heaters.

In Section 2 below, the shortcut rule of minimum temperature approach is considered for the simplest FWH arrangement, namely that the drain is sent to the condenser. A precise statement is given with appropriate boundary conditions and proved analytically. Moreover, it is demonstrated how a double-pinch criterion can be implemented inside an optimization procedure resulting in a significantly simpler optimization formulation than the alternative of simultaneous optimization of all variables. In Section 3 below, the applicability of a double-pinch criterion to other configurations is discussed. In Sections 4 and 5 below, case studies with various FWH configurations are calculated numerically both for the shortcut calculation and for a constant area respectively, discussing also the entropy generation in the feedwater. The systems and methods disclosed herein result in significant savings compared to current design practice for both shortcut and rigorous calculation.

Section 2—Analytical Proof of Double-Pinch for Shortcut Methods

In the following section, a double pinch design criterion is developed and proved based on a set of nonrestrictive assumptions. First, it is demonstrated that only two points in the pinch diagram are of interest, namely the onset of condensation and the outlet of the bleed. Subsequently, for the case that the drain is sent to the condenser, it is proved that for a given heat duty a double pinch is necessary for optimality. Moreover, there exists a unique pair of extraction pressure and flowrate that results in a double pinch. Therefore, a double pinch is also sufficient for optimality. Then, a reordering of variables is disclosed along with a procedure for computationally efficient optimization.

2.1 Two Possibilities for Pinch to Occur

Assumption 1 (Capacity Rates): The ratio of feed flowrate to extraction flowrate is assumed sufficiently high that the capacity rate ($\dot{m}c_p$) of the feed is higher than that of the bleed for both the superheated and subcooled regions. Assumption 1 holds for typical Rankine cycles.

The following proposition shows that in the pinch diagram only two points are of interest, as illustrated graphically in FIG. 2.

Proposition 1: Under Assumption 1, a minimum approach temperature between the feed and bleed can only occur at two points, namely the onset of condensation, and the bleed outlet.

Proof: The feedwater heater can be modeled as a counter-current HX. The feed can always be subcooled and therefore a smooth curve is obtained in the pinch diagram. In contrast, the bleed can consist in general of three regions, namely, the superheated region, the condensation region, and the subcooled region, giving two kinks at the transitions. The region of condensation results in a horizontal line for the bleed, i.e., enthalpy decrease without temperature change. By Assumption 1, the other two curves corresponding to the bleed have a higher slope than the slope of the curve corresponding to the feed. Therefore, in the direction of flow of the bleed from the inlet to the outlet, the superheated and subcooled regions result in convergence between the bleed and the feed curves, whereas in the condensation divergence between the two curves is observed. Consequently, the two potential points for a pinch are the onset of condensation and the bleed outlet. If the bleed inlet is in the two-phase region, the onset of condensation coincides with the inlet.

As noted above, FIG. 2 illustrates a pinch diagram for an illustrative feedwater heater. There are only two possibilities for pinch to occur in a heat regeneration in the FWH of a pure substance: at the cold end of the heat exchanger (drain, small dotted bleed line, labeled o-pinch), or at onset of bleed condensation (large dashed bleed line, labeled p-pinch).

2.2 Analytical Proof of Necessity

In this section, the shortcut method of minimum temperature approach is considered for the case that the drain is sent to the condenser. It is shown that for a given feed flowrate $\dot{m}_F$, feed inlet temperature $T_{F,i}$ and heat transfer duty $\dot{Q}$ a double pinch is optimal except for trivial cases. It is based on relatively weak assumptions.

Assumption 2 (Bleed saturation enthalpy): It is assumed that the enthalpy of the saturated vapor $h^{g,sat}$ at the bleed pressure $P_B$ is not lower than the enthalpy at the turbine outlet $h_T(P_o)$.

$$h^{g,sat}(P_B) \geq h_T(P_o),$$

where the subscript T denotes the turbine (expansion line) and $P_o$ the outlet pressure of the turbine.

Assumption 2 is satisfied for typical expansion lines. It could only be violated if the turbine outlet state is highly superheated and the heat duty is very small allowing for a very low extraction pressure $P_B$. Such an operation is suboptimal.

Assumption 3 (Bleed outlet enthalpy): It is assumed that the enthalpy of the bleed stream in the outlet of the feedwater heater $h_{B,o}$ is not higher than the enthalpy of the turbine outlet $h_T(P_o)$ $$h_{B,o} \leq h_T(P_o).$$

Assumption 3 is satisfied for typical expansion lines and working fluids, e.g., water and ammonia, heptane and toluene.

Assumption 4 (Bleed pressure): It is assumed that the optimal extraction pressure $P_B$ is strictly higher than the turbine outlet pressure $P_o$. Assumption 4 can only be violated if the heat duty of the feedwater heater is extremely low and the outlet of the turbine is highly superheated. In other words, recuperators are not considered in this section.

Assumption 5 (Bleed pressure): It is assumed that the optimal extraction pressure $P_B$ is strictly lower than the turbine inlet pressure. Assumption 5 holds for typical Rankine cycles.

Assumption 6 (Heat capacity and saturated vapor): The following relationship is assumed to hold for the pressures of interest:

$$\left.\frac{\partial h^{g,sat}}{\partial P}\right|_{P_B} \leq c_P^l(T^{sat}(P_B) - \Delta_{MITA}T, P_F) \left.\frac{\partial T^{sat}}{\partial P}\right|_{P_B}.$$

Assumption 6 is satisfied for typical working fluids, such as water, toluene, and ammonia. For the conditions of interest, the expression of the left hand side is either negative or slightly positive, whereas the right hand side is always positive.

Assumption 7 (Positive Pressure Dependence of Liquid Enthalpy): The derivative of the liquid enthalpy with respect to pressure is positive:

$$\left(\frac{\partial h^l}{\partial P}\right)_T > 0.$$

Note that Assumption 7 holds for an incompressible liquid, which is a good approximation for the liquids. Moreover, it holds for typical working fluids, such as water, toluene, and ammonia.

In portions of the following, reheats are excluded for simplicity and a fixed expansion line is considered, essentially assuming that the turbine isentropic efficiency is not affected by the extraction conditions.

Theorem 1 (Double pinch necessary): Consider a regenerative Rankine cycle without reheats and with positive isentropic efficiency of the turbine. Let the turbine inlet temperature, inlet pressure, outlet temperature, and outlet pressure $P_o$ be fixed, i.e., not influenced by the extraction. Consider an arbitrary feedwater heater, specified by an arbitrary but fixed feed flowrate $\dot{m}_F$, feed inlet temperature $T_{F,i}$ and a heat transfer duty $\dot{Q}$. Suppose that the feed pressure $P_F$ is chosen so that the feed stream remains subcooled. Suppose that the feedwater heater can be modeled as a counter-current heat exchanger with a minimum approach temperature $\Delta_{MITA}T$ and without pressure drop. Assume that the extraction state is saturated or superheated, i.e., the extraction temperature is not smaller than the saturation temperature of the extraction pressure. Suppose that the drain is sent to the condenser. Select a pair of extraction flowrate $\dot{m}_B$ and pressure $P_B$ such that the cycle performance is optimized. Under Assumptions 1 through 7, a double-pinch occurs, i.e., the MITA occurs both at the condensation onset and at the outlet of the bleed stream.

Proof: The following proof is done by contraposition, i.e., by considering an optimal pair, $\overline{\dot{m}}_B$, $\overline{P}_B$, assuming that no double pinch occurs and concluding that the pair is not optimal. This is done in three steps, first excluding the case that no pinch occurs, then excluding the case that a pinch occurs only at the onset of condensation, and finally excluding the case that a pinch occurs only at the bleed outlet.

Based on the assumption that no reheat exists, the power that the extraction stream would have generated in the turbine is given by:

$$\dot{W}_B = \dot{m}_B(h_T(P_B) - h_T(P_o)). \tag{1}$$

$h_T(P_B)$ is the enthalpy of the bleed inlet to the feedwater heater $h_T(P_B) = h_{B,i}$. Optimal extraction minimizes this lost power $\dot{W}_B$.

If the extracted steam is saturated steam or in the two-phase region ($h_T(P_B) \leq h^{g,sat}(P_B)$), then the pinch at the onset of condensation is trivially satisfied. Moreover, the pinch at the outlet minimizes $\dot{m}_B$ thus minimizing $\dot{W}_B$ for a given pressure since $P_B > P_o$ is assumed. Thus, it can be assumed that $h_T(P_B) > h^{g,sat}(P_B)$.

1. Suppose for contraposition that the MITA is not reached in the feedwater for ($\overline{P}_B, \overline{\dot{m}}_B$). Then, an infinitesimal reduction of either extraction flowrate or pressure (or even both simultaneously) allows the same heat transfer duty without a violation of the MITA. On the other hand, this reduction implies that more power is produced in the turbine, see Equation (1), or the original pair is not optimal.

2. Assume now that for ($\overline{P}_B, \overline{\dot{m}}_B$), we have a pinch at the onset of condensation but not at the bleed outlet. Maintaining the pinch at the onset of condensation implies that a change in extraction pressure results in a change in extraction flowrate. This is possible without violating any constraints, given Assumption 4. The derivative of the extraction mass flowrate following pinch at the onset of condensation with-respect to extraction pressure is $$\left(\frac{\partial \dot{m}_B}{\partial P_B}\right)_p,$$

where the subscript p stands for p-pinch.

Consider the partial derivative of the power not produced in the turbine with respect to the extraction pressure following the pinch at the onset of condensation evaluated at $(\overline{P}_B, \overline{\dot{m}}_B)$ $$\frac{\partial \dot{W}_B}{\partial P_B}\bigg|_{\overline{P}_B} = \left(\frac{\partial \dot{m}_B}{\partial P_B}\right)_p\bigg|_{\overline{P}_B}(h_t(\overline{P}_B) - h_t(P_o)) + \overline{\dot{m}}_B \frac{\partial h_t}{\partial P_B}\bigg|_{\overline{P}_B} \quad (2)$$

where we have used the fact that the turbine inlet and outlet states are fixed. Optimal operation implies minimal $\dot{W}_B$, or if we find that $$\frac{\partial \dot{W}_B}{\partial P_B}\bigg|_{\overline{P}_B} \neq 0$$

then the pair $(\overline{P}_B, \overline{\dot{m}}_B)$ is not optimal.

In the right-hand side of Equation (2), the second term is positive $$\left(\frac{\partial h_T}{\partial P_B} > 0\right),$$

since the turbine produces work. Thus, if the derivative $$\left(\frac{\partial \dot{m}_B}{\partial P_B}\right)_p$$

evaluated at $\overline{P}_B$ is nonnegative, we also have $$\frac{\partial \dot{W}_B}{\partial P_B}\bigg|_{\overline{P}_B} > 0$$

or the pair $(\overline{P}_B, \overline{\dot{m}}_B)$ is not optimal. This would imply that we can reduce both extraction pressure and flowrate and maintain the same preheating. Note that $$\left(\frac{\partial \dot{m}_B}{\partial P_B}\right)_p < 0$$

can be directly proved.

We thus only need to consider the case $$\left(\frac{\partial \dot{m}_B}{\partial P_B}\right)_p\bigg|_{\overline{P}_B} < 0. \quad (3)$$

It is shown below that the derivative of the power lost with respect to the extraction pressure is negative, or increasing the extraction pressure increases efficiency.

An expression for $$\left(\frac{\partial \dot{m}_B}{\partial P_B}\right)_p$$

is generated in the following. The condition for a pinch at the onset of condensation is $$\dot{m}_F(h_{F,o} - h^l(T^{sat}(P_B - \Delta_{MITA}T, P_F)) = \dot{m}_B(h_T(P_B) - h^{g,sat}(P_B)).$$

Taking the derivative with respect to $P_B$ and evaluating at $(\overline{P}_B, \overline{\dot{m}}_B)$ gives $$-\dot{m}_F c_P(T^{sat}(\overline{P}_B) - \Delta_{MITA}T, P_F)\frac{\partial T^{sat}}{\partial P}\bigg|_{\overline{P}_B} = \quad (4)$$

$$\left(\frac{\partial \dot{m}_B}{\partial P_B}\right)_p\bigg|_{\overline{P}_B}(h_t(\overline{P}_B) - h^{g,sat}(\overline{P}_B)) + \overline{\dot{m}}_B \frac{\partial h_t}{\partial P_B}\bigg|_{\overline{P}_B} - \overline{\dot{m}}_B \frac{\partial h^{g,sat}}{\partial P}\bigg|_{\overline{P}_B}$$

or $$\left(\frac{\partial \dot{m}_B}{\partial P_B}\right)_p\bigg|_{\overline{P}_B}(h_T(\overline{P}_B) - h^{g,sat}(P_B)) = \overline{\dot{m}}_B \frac{\partial h_t}{\partial P_B}\bigg|_{\overline{P}_B} + \overline{\dot{m}}_B$$

$$\frac{\partial h^{g,sat}}{\partial P}\bigg|_{\overline{P}_B} - \dot{m}_F c_P(T^{sat}(\overline{P}_B) - \Delta_{MITA}T, P_F)\frac{\partial T^{sat}}{\partial P}\bigg|_{\overline{P}_B}$$

By Assumption 2 we have $h_T(P_o) \leq h^{g,sat}(\overline{P}_B)$ and therefore $$h_T(\overline{P}_B) - h^{g,sat}(\overline{P}_B) \leq h_T(\overline{P}_B) - h_T(P_o).$$

Recalling Inequality (3) we thus obtain $$(h_T(\overline{P}_B) - h_T(P_O))\left(\frac{\partial \dot{m}_B}{\partial P_B}\right)_p\bigg|_{\overline{P}_B} \leq (h_T(\overline{P}_B) - h^{g,sat}(\overline{P}_B))\left(\frac{\partial \dot{m}_B}{\partial P_B}\right)_p\bigg|_{\overline{P}_B}$$

and therefore combining Equations (2) and (4) we obtain $$\frac{\partial \dot{W}_B}{\partial P_B}\bigg|_{\overline{P}_B} \leq +\overline{\dot{m}}_B \frac{\partial h^{g,sat}}{\partial P}\bigg|_{\overline{P}_B} - \dot{m}_F c_P(T^{sat}(\overline{P}_B) - \Delta_{MITA}T, P_F)\frac{\partial T^{sat}}{\partial P}\bigg|_{\overline{P}_B}$$

Noting that $\overline{\dot{m}}_B < \dot{m}_F$ by Assumption 6 we obtain $$\frac{\partial \dot{W}_B}{\partial P_B}\bigg|_{\overline{P}_B} < 0.$$

By Assumption 5 it is possible to increase the pressure and thus we have shown that $(\overline{P}_B, \overline{\dot{m}}_B)$ is not optimal.

3. Assume finally that for $(\overline{P}_B, \overline{\dot{m}}_B)$ we have a pinch at the bleed outlet but not at the onset of condensation.

Similarly to the previous case, we will consider variation of the extraction pressure by maintaining the pinch at the bleed outlet $$\left(\frac{\partial \dot{m}_B}{\partial P_B}\right)_o,$$

i.e., the derivative of the extraction mass flowrate following pinch at the bleed outlet with respect to extraction pressure, where the subscript o stands for o-pinch.

Equivalently to the previous case we obtain $$\left.\frac{\partial \dot{W}_B}{\partial P_B}\right|_{\overline{P}_B} = \left.\left(\frac{\partial \dot{m}_B}{\partial P_B}\right)_O\right|_{\overline{P}_B}(h_t(\overline{P}_B)-h_t(P_o)) + \overline{\dot{m}}_B \left.\frac{\partial h_t}{\partial P_B}\right|_{\overline{P}_B} \quad (5)$$

and $$\left.\left(\frac{\partial \dot{m}_B}{\partial P_B}\right)_O\right|_{\overline{P}_B} < 0. \quad (6)$$

We then show that the derivative of the power lost with respect to the extraction is positive, implying that the extraction pressure should be decreased.

An expression for $$\left(\frac{\partial \dot{m}_B}{\partial P_B}\right)_O$$

is generated in the following. The heat transfer duty maintaining a pinch at the outlet can be calculated as $$\dot{Q} = \dot{m}_B(h_T(P_B) - h^l(T_{T,i} \Delta_{MITA} T, P_B))$$

Noting that the total heat transfer is constant, the derivative with respect to $P_B$ is zero. Evaluating the derivative of the right hand side at $(\overline{P}_B, \overline{\dot{m}}_B)$ thus gives $$0 = \left.\left(\frac{\partial \dot{m}_B}{\partial P_B}\right)_O\right|_{\overline{P}_B}(h_T(\overline{P}_B) - h^l(T_{T,i} + \Delta_{MITA}T, \overline{P}_B)) + \quad (7)$$

$$\overline{\dot{m}}_B \left.\frac{\partial h_T}{\partial P_B}\right|_{\overline{P}_B} - \overline{\dot{m}}_B \left.\frac{\partial h^l}{\partial P_B}\right|_{T_{T,i}+\Delta_{MITA}T,\overline{P}_B}$$

or $$\left.\left(\frac{\partial \dot{m}_B}{\partial P_B}\right)_O\right|_{\overline{P}_B}(h_T(\overline{P}_B) - h^l(T_{T,i} + \Delta_{MITA}T, \overline{P}_B)) = -\overline{\dot{m}}_B$$

$$\left.\frac{\partial h_T}{\partial P_B}\right|_{\overline{P}_B} + \overline{\dot{m}}_B \left.\frac{\partial h^l}{\partial P_B}\right|_{T_{T,i}+\Delta_{MITA}T,\overline{P}_B}$$

By Assumption 3 we have $h^l(T_{T,i}+\Delta_{MIA}T, \overline{P}_B) = h_{B,o} \le h_T(P_o)$ and therefore $$h_T(\overline{P}_B) - h^l(T_{T,i}+\Delta_{MITA}T, \overline{P}_B) \ge h_T(\overline{P}_B) - h_T(P_o).$$

Recalling Inequality (6) we thus obtain $$(h_T(\overline{P}_B) - h_T(P_O))\left.\left(\frac{\partial \dot{m}_B}{\partial P_B}\right)_O\right|_{\overline{P}_B} \ge$$

$$(h_T(\overline{P}_B) - h^l(T_{T,i}+\Delta_{MITA}T, \overline{P}_B))\left.\left(\frac{\partial \dot{m}_B}{\partial P_B}\right)_O\right|_{\overline{P}_B}$$

and therefore by (7)

$$(h_T(\overline{P}_B) - h_T(P_o))\left.\left(\frac{\partial \dot{m}_B}{\partial P_B}\right)_O\right|_{\overline{P}_B} \ge -\overline{\dot{m}}_B \left.\frac{\partial h_T}{\partial P}\right|_{\overline{P}_B} + \overline{\dot{m}}_B \left.\frac{\partial h^l}{\partial P}\right|_{T_{T,i}+\Delta_{MITA}T,\overline{P}_B}$$

which together with (5) gives $$\left.\frac{\partial \dot{W}_B}{\partial P_B}\right|_{\overline{P}_B} \ge +\overline{\dot{m}}_B \left.\frac{\partial h^l}{\partial P}\right|_{T_{T,i}+\Delta_{MITA}T,\overline{P}_B}$$

and by Assumption 7 we obtain $$\left.\frac{\partial \dot{W}_B}{\partial P_B}\right|_{\overline{P}_B} > 0.$$

By Assumption 4 it is possible to decrease the pressure and thus we have shown that at $(\overline{P}_B, \overline{\dot{m}}_B)$ is not optimal.

2.3 Graphical Proof of Uniqueness and Sufficiency

Theorem 1 proves that a double pinch is a necessary condition for optimality. In principle, it allows for multiple double pinches, out of which some may be suboptimal. Under two additional assumptions it is possible to prove that for a given heat duty there exists a unique pair $(P_B, \dot{m}_B)$ that gives a double pinch.

Assumption 8 (Weak Pressure Dependence of Subcooled State): The derivative of the liquid enthalpy with respect to pressure is smaller than the derivative of the enthalpy in the expansion line $$\left.\frac{\partial h^l}{\partial P}\right|_{T,P_B} < \left.\frac{\partial h_T}{\partial P}\right|_{P_B} \quad (8)$$

Moreover, the heat capacity in the subcooled region is assumed to be a weak function of pressure for the temperatures and pressures of interest, or more precisely for any two pressures $P_{B1}$, $P_{B2}$ such that $P_{B1} > P_{B2}$ we have $$\frac{c_p^l(T, P_{B1})}{c_p^l(T, P_{B2})} < \frac{h_T(P_{B1}) - h^l(T, P_{B1})}{h_T(P_{B2}) - h^l(T, P_{B2})} \quad (9)$$

Both clauses of Assumption 8 hold unless the turbine efficiency is extremely low.

Assumption 9 (Enthalpy of Vaporization Decreasing): The derivative of the enthalpy of vaporization with respect to pressure is negative $$\frac{\partial h^{lg}}{\partial P} < 0.$$

Assumption 9 holds for pure substances. This is discussed in detail in B. E. Poling, J. M. Prausnitz, J. P. O'Connell, The Properties of Gases and Liquids, 5th Edition, McGraw Hill, New York, 2001, the entire contents of which are incorporated herein.

Lemma 1 (Double pinch unique): Consider the conditions and assumptions of Theorem 1. Under the additional Assumptions 8 and 9 there exists a unique pair of extraction flowrate $\dot{m}_B$ and pressure $P_B$ that gives a double pinch.

Proof: Consider a pair $(P_{B1}, \dot{m}_{B1})$ that results in a double pinch. Consider a second pair $P_{B2}, \dot{m}_{B2}$ with $P_{B2} < P_{B1}$ that results in a pinch at the outlet. We will show that it violates the minimal approach temperature at the onset of condensation.

Figure 4:
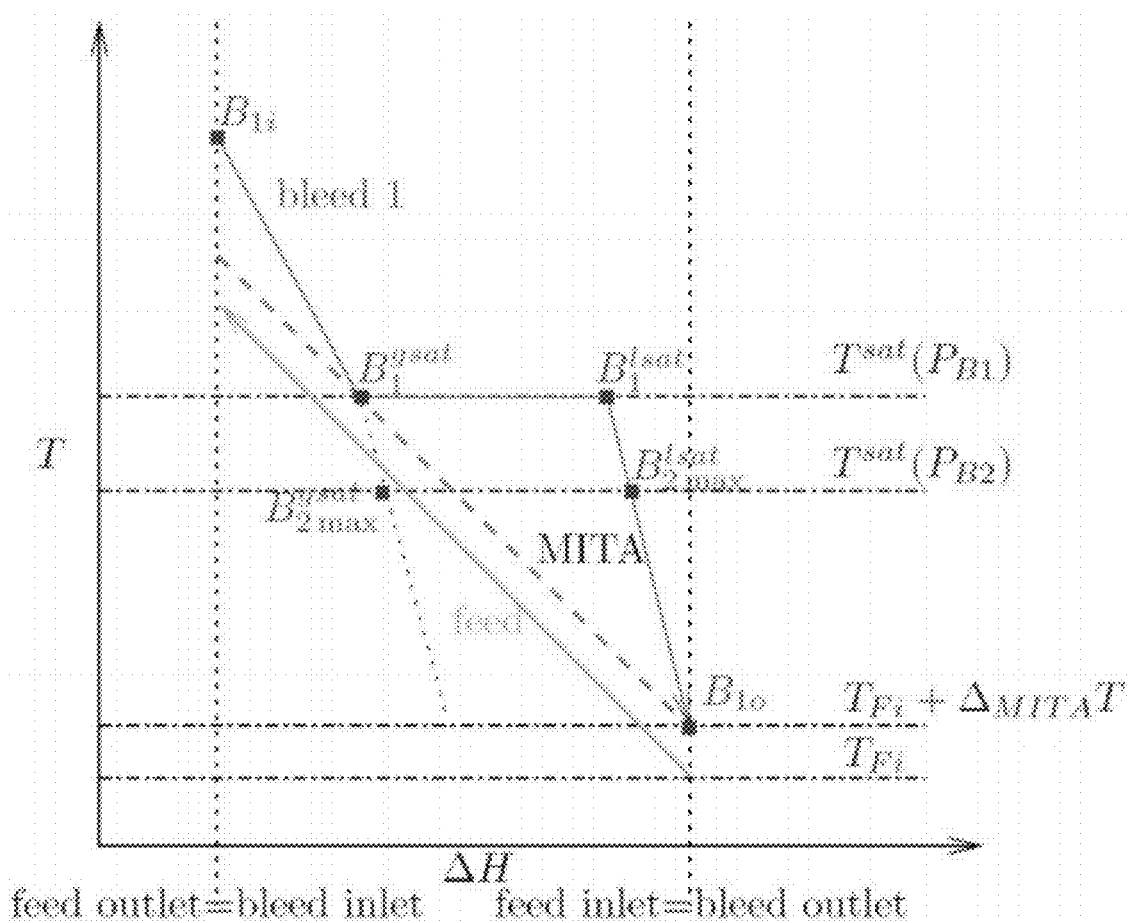
FIG. 4 is a pinch diagram demonstrating the uniqueness of the double pinch.

Consider the pinch diagram, shown in FIG. 4, noting that no linearity is assumed (which would require constant heat capacity in some regions). By Assumption 1, the slopes of the subcooled curves are bigger than that of the feed for both bleeds.

Let the points $B_{1i}, B_1^{gsat}, B_1^{lsat}$ and $B_{1o}$ denote respectively the inlet of the bleed, the onset of condensation, the onset of subcooling, and the outlet of the bleed. Moreover, let $B_{2max}^{lsat}$ denote the intersection of the saturation temperature at pressure $P_{B2}$ with the subcooled curve of bleed 1. Finally, let $B_{2max}^{gsat}$ denote the intersection of the saturation temperature at pressure $P_{B2}$ sat with a parallel to the subcooled curve of bleed 1 going through $B_1^{gsat}$.

For bleed 2 to achieve pinch at the outlet, its outlet coincides with $B_{1o}$. Note that pinch at the outlet implies $$\dot{Q} = \dot{m}_{B1}(h_T(P_{B1}) - h^l(T_{T,i} + \Delta_{MITA}T, P_{B1}))$$

$$\dot{Q} = \dot{m}_{B2}(h_T(P_{B2}) - h^l(T_{T,i} + \Delta_{MITA}T, P_{B2})).$$

We will now employ the two inequalities in Assumption 8. By (8) the two conditions for $\dot{Q}$ directly imply that $\dot{m}_{B2} > \dot{m}_{B1}$. Moreover, by (9) the same assumption, the onset of subcooling of bleed 2 is to the left of $B_{2max}^{lsat}$. Finally, together with Assumption 9, the onset of condensation is to the left of $B_{2max}^{gsat}$. Recalling that the slope of the bleed is higher than that of the feed, this point is to the left of the minimum temperature approach.

Since the bleed pressures $P_{B1}, P_{B2}$ are arbitrary, we can also exclude the case of a double pinch with higher pressure than $P_{B1}$ say $P_{B3}$. Indeed, suppose that we have a double pinch for the bleed pressure $P_{B3}$. By the above arguments $P_{B1}$ violates the minimal approach temperature leading to a contradiction.

Theorem 2: Under the assumptions of Theorem 1 and Lemma 1, the unique pair $(P_B, \dot{m}_B)$ that gives a double pinch is optimal. The proof of Theorem 2 is trivial and is omitted here for the sake of brevity. Note that we take existence for granted; this is justified by the change of variables in the next subsection.

2.4 Procedure for Cycle-Optimization

Theorems 1 and 2 prove that a double pinch is optimal for a fixed heat duty. However, it is computationally more efficient to vary the extraction pressure in both shortcut of pinch analysis and fixed area approach.

2.4.1 Procedure for Pinch Analysis

For the pinch analysis approach, it is possible to directly calculate the pair of extraction flowrate $\dot{m}_B$ and heat duty $\dot{Q}$ that leads to double pinch $$\dot{m}_B = \dot{m}_F \frac{h^{g,sat}(P_B) - h^l(T_{F,i} + \Delta_{MITA}T, P_B)}{h^l(T^{sat}(P_B) - \Delta_{MITA}T, P_F) - h^l(T_{F,i}, P_F)} \quad (10)$$

$$\dot{Q} = \dot{m}_B(h_T(P_B) - h^l(T_{F,i} + \Delta_{MITA}T, P_B))$$

Since the expressions are explicit in $\dot{m}_B$ and $\dot{Q}$ there is a unique double pinch for a given extraction pressure $P_B$. One of the advantages of this change of independent variable is that the explicit equations for the occurrence of pinches eliminate the need for a spatially distributed model of the feedwater heater. However, we have not yet proved whether a double pinch is optimal for a fixed pressure. It is therefore necessary to demonstrate that the change in variables does not result in convergence to spurious solutions when used inside an optimization routine. In the following, it will be shown that a global/local optimum in the pressure space following the double-pinch implies a global/local optimization of the design and operation.

Proposition 2 (Extraction pressure as independent variable does not introduce complications): Let the superscript $k = 1, \ldots, n$ denote the feedwater k. Suppose that optimization is performed with respect to the extraction flowrates $P_B^k$ with the heat duty $\dot{Q}^k$ and extraction flowrate $\dot{m}_B^k$ specified by (10) and that $\overline{P}_B^k$ is found optimal in a set $P^k$. Denote the corresponding extraction flowrates $\overline{\dot{m}}_B^k$ and heat duties $\overline{\dot{Q}}^k$. If $P^k$ contains all possible extraction pressures, then the triplets $(\overline{P}_B, \overline{\dot{m}}_B^k, \overline{\dot{Q}}^k)$ give a globally optimal power cycle efficiency. If $P^k$ is a neighborhood with $\overline{P}_B^k$ in the interior, the triplets give a locally optimal power cycle efficiency.

Proof: Consider first the case that the sets $P^k$ encompass all possible extraction pressures. This implies that the triplets $(\overline{P}_B, \overline{\dot{m}}_B^k, \overline{\dot{Q}}^k)$ are optimal over all triplets leading to a double pinch, and therefore by Theorem 1 also optimal over all triplets.

Consider now the case that $P^k$ are neighborhoods with $\overline{P}_B^k$ in the interior. Assume first that there is a single feedwater heater $k = n = 1$. Let the solution to (10) as a function of the extraction pressure $P_B^k$ be denoted as $\dot{m}_{B,d}^s(P_B^k), \dot{Q}_d^k(P_B^k)$. Local optimality implies $$\eta(P_B^k, \dot{m}_{B,d}^k(P_B^k), \dot{Q}_d^k(P_B^k)) \leq \eta(\overline{P}_B^k, \overline{\dot{m}}_B^k, \overline{\dot{Q}}^k), \forall P_B^k \in P^k$$

The continuity of the mappings in (10) implies that the image of $\dot{Q}_d^k$ on $P^k$ is an interval. Proposition 1 ensures a unique double pinch for a fixed heat duty and thus $\overline{Q}_k$ is not at the boundary of the interval. By Theorem 1 for any $P_B^k$ we have $$\eta(\hat{P}_B^k, \dot{m}_B^k, \dot{Q}_d^k(P_B^k)) \leq \eta(P_B^k, \dot{m}_{B,d}^k(P_B^k), \dot{Q}_d^k(P_B^k)), \forall P_B^k,$$
$$\dot{m}_B^k$$

Thus, there exists a neighborhood with $(\overline{P}_B^k, \overline{\dot{m}}_B^k, \overline{\dot{Q}}^k)$ in the interior for which $(\overline{P}_B^k, \overline{\dot{m}}_B^k, \overline{\dot{Q}}^k)$ is optimal. This is the definition of a local minimum.

Assume now multiple FWHs for the case of local optimality. Recall that the flowsheet has one or multiple points with fixed temperature, e.g., the condenser. Move in direction of the feed and between each of these points divide the feedwater heaters in pairs and if needed an additional feedwater heater. For the pairs consider a variation of the extraction pressure $P_B^k$ in a neighborhood containing $\overline{P}_B^k$ interior for the first and adjust the second $P_B^{k+1}$ such that the sum of the heat duties remains constant $\dot{Q}^{k+1} + \dot{Q} = \overline{Q}^{k+1} + \overline{Q}^k$. Similarly to the case of a single feedwater heater, we can use uniqueness and continuity (with respect to extraction pressure and feed inlet temperature) to construct a neighborhood with $\overline{Q}^k, \overline{Q}^{k+1}$, in the interior and prove local optimality. Given that the pair has a constant sum of heat duties, we can treat the odd (separate) feedwater heater similarly to the case of a single feedwater heater.

2.4.2 Procedure for Fixed Area

The double-pinch criterion can also be applied in the case of fixed heat transfer area, but some iterative procedure can be required. The optimal procedure somewhat depends on the flowsheeting software used. There are several plausible choices, and here only some exemplary options are discussed. The general recommendation is to have the extraction pressure $P_B$ as the main optimization variable. Then, for a given heat transfer area and extraction pressure, the double-pinch criterion fully specifies the operation of the FWH, by eliminating one variable, e.g., the bleed flowrate. Note that the value of the pinch is an unknown and that the operation is only implicitly specified.

The first main choice is to either let the optimizer control an additional variable to satisfy a nonlinear constraint, or mask this pair from the optimizer and embed it as a design specification inside the objective function evaluation. The former procedure is described in L. T. Biegler, Nonlinear Programming: Concepts, Algorithms, and Applications to Chemical Processes, MPS-SIAM Series on Optimization, SIAM-Society for Industrial and Applied Mathematics, 2010, the entire contents of which are incorporated herein. In some embodiments, however, the use of embedded design specifications can be more favorable, because it can avoid failures at the simulation level.

The second consideration is which pair of variable and constraint to select. Herein, the bleed flowrate $\dot{m}_B$ is adjusted to meet the double-pinch criterion. This requires a calculation of the heat transfer in the FWH for each iteration ("HX analysis"). Once this calculation is performed, the values of the two pinch points can be obtained from the temperature profiles or from solving (10). An alternative is to vary the value of the pinch $\Delta_{MITA}T$ to meet the given heat transfer area. In this alternative, the bleed flowrate and heat transfer duty can be calculated explicitly from (10) but the calculation of the heat transfer area is required ("HX design").

3 Other Feedwater Configurations

As aforementioned, there are several FWH configurations. For most configurations, the double pinch criterion is plausible but it is outside the scope of this disclosure to prove analytically. As shown in Table 3 below, for some configurations, the criterion may not be applicable.

3.1 Drain to Open Feedwater Heater

In the above analytical proofs it was assumed that the drain is sent to the condenser. For high-pressure CFWHs a better choice in some embodiments is to send the drain to the next possible deaerator or OFWH, since this allows the recovery of some of the remaining availability and reduces the load on the condenser and the pumps. The proof employed in Theorem 1 assumes that the drain does not affect the temperature of the feed inlet and therefore is not directly applicable to the case that the drain is sent to the condenser. The double pinch criterion is applicable to this feedwater configuration as well. While an analytical proof is outside the scope of this disclosure, numerical examples are given in Section 5.

3.2 Cascading (Downwards)

In high-efficiency cycles with multiple CFWHs, it is customary to cascade the bleeds downwards, namely, send the drain to the next CFWH (immediately lower pressure) and mix it with the bleed inlet. Similarly to sending to an OFWH, some of the remaining availability is captured. While an analytical proof is outside the scope of this disclosure, numerical examples in Section 4 and Section 5 demonstrate that the double pinch criterion can have application in this configuration as well.

3.3 Pumping to Feed

Figure 5A:
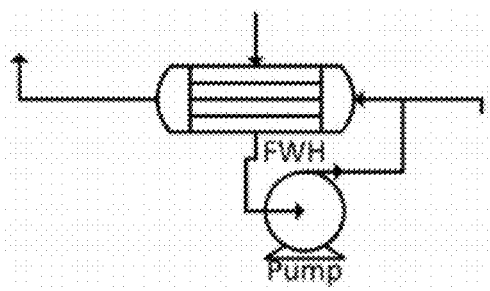
FIG. 5A is a schematic diagram of a feedwater heater in which the drain is pumped backwards or downwards.
Figure 5B:
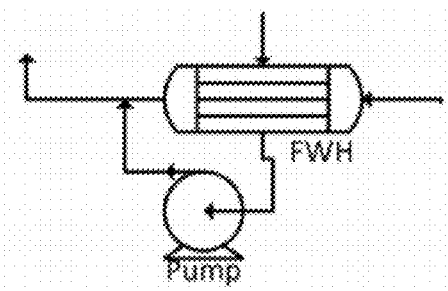
FIG. 5B is a schematic diagram of a feedwater heater in which the drain is pumped forwards or upwards.

One flowsheet configuration is to pump the drain to the feed pressure and mix the feed, as shown in FIGS. 5A-5B. One alternative, shown in FIG. 5A is to mix at the inlet of the CFWH, which is referred to as pumping backwards (or downwards). The other alternative, shown in FIG. 5B is to pump forward (or upward), i.e., to mix with the feed at the outlet of the CFWH. For either of the pumping configurations, double pinch is an optimal selection of bleed pressure and flowrate for the pinch analysis but not the unique optimum. For the constant area approach, double pinch is not advisable. In general, an optimal selection is to achieve pinch at the onset of condensation and just enough subcooling at the outlet to ensure that no technical difficulties arise for pumping. Similarly to the double pinch criterion, this gives two constraints which can be used to eliminate two of the three variables.

Assumption 10 (Feed inlet enthalpy): It is assumed that the enthalpy of the feed inlet to the feedwater heater $h_{F,i}$ is not higher than the enthalpy of the turbine outlet $h_T(P_o)$ $$h_{F,i} \leq h_T(P_o).$$

Assumption 3 is satisfied for typical expansion lines and working fluids, e.g., water and ammonia, heptane and toluene.

Theorem 3 (p-pinch for pumping configuration): Consider a regenerative Rankine cycle without reheats and with positive isentropic efficiency of the turbine. Let the turbine inlet temperature, inlet pressure, outlet temperature and outlet pressure $P_o$ be fixed, i.e., not influenced by the extraction. Consider an arbitrary feedwater heater, specified by an arbitrary but fixed feed flowrate $\dot{m}_F$, feed inlet temperature $T_{F,i}$ and a heat transfer duty $\dot{Q}$. Suppose that the feed pressure $P_f$ is chosen so that the feed stream remains subcooled. Suppose that the feedwater heater can be modeled as a counter-current heat exchanger with a minimum approach temperature $\Delta_{MITA}T$ and without pressure drop. Assume that the extraction state is saturated or superheated, i.e., the extraction temperature is not smaller than the saturation temperature of the extraction pressure. Suppose that the drain is pumped to $P_f$ and mixed with the feed in the inlet or outlet of the FWH. Select a pair of extraction flowrate $\dot{m}_B$ and pressure $P_B$ such that the cycle performance is optimized. Under Assumption 10, the MITA occurs at the condensation onset. Moreover, subcooling of the drain to achieve the double pinch adds heat transfer area without increase of efficiency.

Proof: We first show the necessity of pinch at the onset of condensation by contraposition. Suppose that the pair $(\bar{P}_B, \bar{\dot{m}}_B)$ is optimal and the pinch does not occur at the onset of condensation. For any pair $(P_B, \dot{m}_B)$, the first law neglecting the pump power gives $$\dot{m}_{F,i} h_{F,i} + \dot{m}_B h_T(P_B) = \dot{m}_{F,o} h_{F,o},$$

where the inlet state i is before mixing and the outlet state o after mixing. Similarly, the mass balance gives $$\dot{m}_{F,i} + \dot{m}_B = \dot{m}_{F,o}.$$

Combining the last two equations we obtain $$(\dot{m}_{F,o} - \dot{m}_B) h_{F,i} + \dot{m}_B h_T(P_B) = \dot{m}_{F,o} h_{F,o}$$

and therefore $$\dot{m}_B (h_T(P_B) - h_{F,i}) = \dot{m}_{F,o}(h_{F,o} - h_{F,i})$$

We differentiate and evaluate at $(\bar{P}_B, \bar{\dot{m}}_B)$ $$\left(\frac{\partial \dot{m}_B}{\partial P_B}\right)_{T_o}\bigg|_{\bar{P}_B, \bar{\dot{m}}_B} (h_T(\bar{P}_B) - h_{F,i}) + \bar{\dot{m}}_B \frac{\partial h_T}{\partial P_B}\bigg|_{\bar{P}_B} = 0$$

By Assumption 10 we have $h_{F,i} \leq h_T(P_o)$ and thus $$h_T(\bar{P}_B) - h_{F,i} \geq h_T(\bar{P}_B) - h_T(P_o)$$

and therefore $$\frac{\partial \dot{W}_B}{\partial P_B}\bigg|_{\bar{P}_B} = \left(\frac{\partial \dot{m}_B}{\partial P_B}\right)_{T_o}\bigg|_{\bar{P}_B} (h_t(\bar{P}_B) - h_t(P_o)) + \bar{\dot{m}}_B \frac{\partial h t}{\partial P_B}\bigg|_{\bar{P}_B} \quad (11)$$

Similarly to the proof of Theorem 1, we have $$\frac{\partial \dot{W}_B}{\partial P_B}\bigg|_{\bar{P}_B} > 0$$

and therefore $\bar{P}_B$ is not optimal.

We will now demonstrate that a double pinch is not advisable in terms of the heat transfer area. Suppose that the pair $(\overline{P}_B, \overline{\dot{m}}_B)$ is optimal and the pinch occurs at the onset of condensation and at the drain outlet. Keep the extraction conditions and partition the heat exchanger into two segments: (i) for cooling the vapor and condensation and (ii) for the subcooling. If we eliminate the second segment, we still achieve complete condensation: in the case of pumping backward the inlets to segment (i) are unchanged; in the case of pumping forward, the feed inlet to segment (i) is colder resulting in higher heat transfer rate (the effect of lower flowrate on the heat transfer rate is neglected). Moreover, eliminating the second segment does not change the state of the feed outlet (after mixing); this is obvious by the first law and mass balance. In conclusion, the heat transfer area can be reduced without loss in performance.

3.4 Open Feedwater Heater

For the sake of completeness, OFWHs are also considered. Clearly, OFWHs do not fall in the same category as CFWHs and thus the double pinch criterion is not directly applicable. On the other hand, it is still worthwhile to optimize the extraction pressure and flowrate. There are still three optimization variables for each OFWH, namely the operating pressure and the bleed pressure and flowrate. Following the same procedure as in the proof of Theorem 3, one can show that the optimal extraction pressure is equal to the deaerator operating pressure. Moreover, the bleed flowrate is given by the desired temperature increase and the requirement for saturation at the feed outlet. Thus, similarly to the CFWHs, only one variable has to be optimized.

4 Numerical Examples With a Simple Flowsheet

In this Section, the validity of the design criterion is demonstrated for a single FWH and multiple FWHs numerically. Power cycles with cascading and non-cascading FWHs are considered. In addition to a prespecified minimum temperature approach, the design criterion is demonstrated for the case of prespecified area. For the sake of simplicity and compactness, the same cycle is used to validate the criterion for both single and multiple feedwater heaters.

Figure 6:
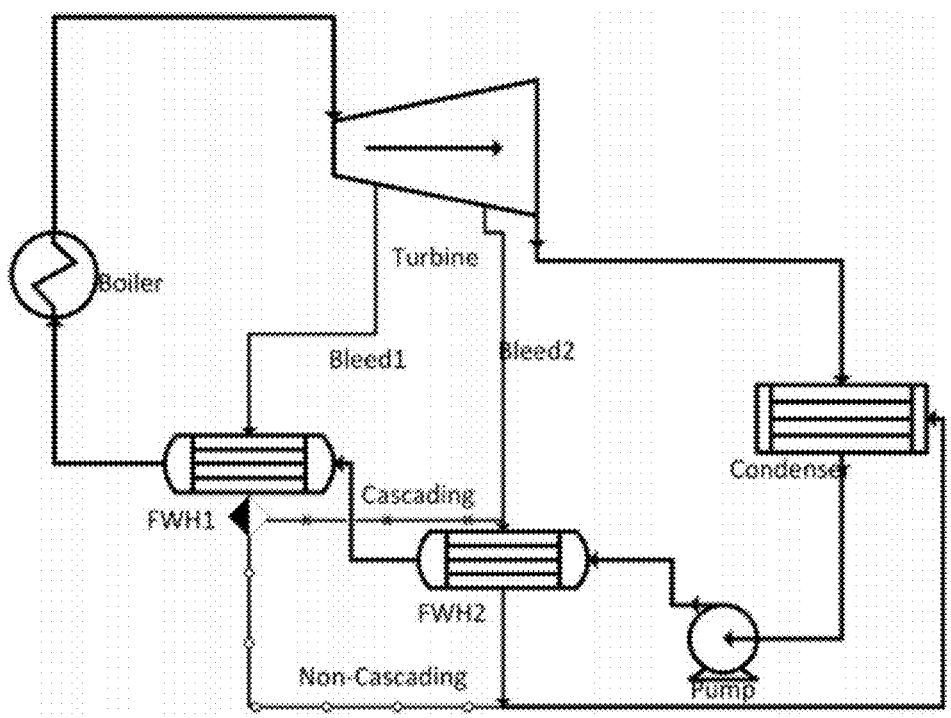
FIG. 6 is a flowsheet for a numerical validation of the double pinch criterion.

A simple Rankine cycle implemented in ASPENPLUS is shown in FIG. 6 and used to explain the importance of the double-pinch criterion. Feedwater exiting the condenser, at the condenser pressure of 0.04 bar and with a flowrate of 100 kg/s, is compressed to the boiler pressure 100 bar, before entering the FWHs. The pressure in the condenser is below atmospheric which implies the need for a deaerator, not modeled herein for simplicity; this does not affect the results and the deaerator is considered in Section 5. The temperature of the feedwater increases as thermal energy is transferred from the bleeds passing through the heaters. Feedwater is then heated in the boiler to a fixed outlet temperature of 500° C. before entering the steam expansion line where power is produced from the steam turbine. Two extractions, one for each bleed, are present in the expansion line. Two bleed configurations are shown, cascading and non-cascading. In both configurations, the bleed stream exiting FWH2 is mixed with the main feedwater stream at the condenser. In the cascading configuration (marked by x in FIG. 6), the bleed at the exit of FWH1 is mixed with the lower pressure bleed before entering the FWH2. In contrast, in the non-cascading configuration (marked by in FIG. 6), the exiting bleed from FWH1 proceeds directly to the condenser. The cycle efficiency reported is the ratio of the net produced power (turbine power minus pump power), to the heat transfer rate in the boiler. For the sake of simplicity, no pressure drops are considered and the turbomachinery is assumed to be irreversible. Note that this nonrealistic assumption does not affect the qualitative results and a more realistic case study is given in Section 5.

4.1 Single Feedwater Heater

The regeneration scheme shown in FIG. 6 has two closed FHWs. Only the non-cascading configuration is discussed in this subsection and only FWH1 (high-pressure) is analyzed. In contrast, the FWH2 (low-pressure) is considered fixed as follows:

$P_{B2}$=0.158 bar, $\dot{m}_{B2}$=4.73 kg/s, $\dot{Q}_2$=9.50 MW

The specifications for FWH2 are chosen to result in a double pinch with a value of 3° C. This arbitrary specification does not affect the results presented in this subsection, since they only affect the overall efficiency.

4.1.1 Minimal Approach Temperature

Figure 7:
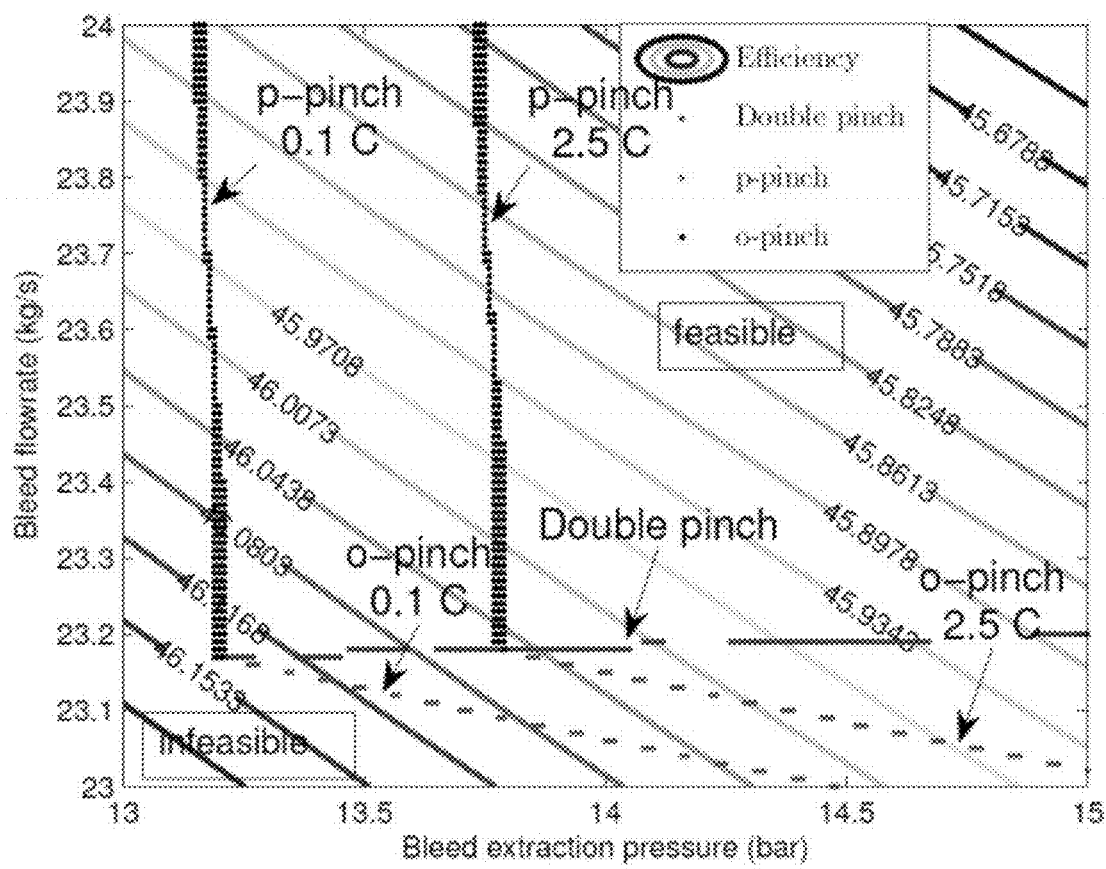
FIG. 7 is a map of efficiency contours for the flowsheet of FIG. 6.

As aforementioned, a common shortcut method in system-level analysis and optimization is the pinch analysis. The proposed double-pinch criterion is validated numerically for this shortcut calculation. The heat transfer duty in FWH1 is fixed to $\dot{Q}$=60.7 MW. This value is selected based on approximately optimal performance of the cycle. As aforementioned, this heat transfer duty can be achieved for different combinations of bleed flowrate and pressure, resulting in different MITA and heat transfer area required. The bleed flowrate and pressure are discretized with 200 points each, in the range:

$P_{B1} \in [13,15]$ bar, $\dot{m}_{B1} \in [22,24]$ kg/s and the flowsheet of FIG. 6 is simulated in ASPENPLUS for each value. The results are illustrated in FIG. 7, which shows contours of efficiency as a function of the two variables. This corresponds to the optimization objective function and is increasing with decreasing extraction pressure and flowrate. FIG. 7 also shows the optimization constraints, namely the two possible pinch points, at the onset of condensation and at the feedwater outlet for two given MITA. These pairs of lines define the feasible region for higher pressure and/or flowrate (region to the upper right), and the infeasible operation, i.e., operation violating a given MITA (region to the lower left). The pairs of lines intersect at the double-pinch operation for a given MITA and the figure shows the union of all intersection points. For a given MITA the double pinch is at a higher contour line compared to either of the two pinch lines. Mathematically, this can be expressed as the gradient of the objective function lying in the feasible cone defined by the constraints. In other words, if one follows either of the pinch lines the efficiency increases towards the double pinch and decreases away from it. From the graph, two more facts are evident that can be also proved analytically: (i) the pressure of the bleed at the double pinch is the smallest extraction pressure that allows for a pinch at the outlet of the FWH; and (ii) the flowrate of the bleed at the double pinch is the smallest flowrate that allows for a pinch at the onset of phase change.

In FIG. 7, pinch lines are super imposed: pinch at onset of condensation with a MITA of 0.1° C. and 2.5° C. (dashed lines labeled p-pinch); pinch at outlet of FWH with a MITA of 0.1° C. and 2.5° C. (dashed lines labeled o-pinch); double-pinch with variable MITA values (intersection of two pinch lines).

Maximizing the efficiency is equivalent to minimizing total entropy generation in the system, or total exergy destruction. It is well-known that minimal system entropy generation is not necessarily equivalent to minimal entropy generation for each component. For instance, for a minimal entropy generation in the FWH, a zero heat transfer duty is preferable which results in a suboptimal cycle performance. However, the numerical results suggest that for this simple flowsheet, optimal design and operation of the FWH coincides with minimal entropy generation in the FWH for fixed heat transfer duty and MITA. This is demonstrated in FIG. 8, which plots the contours of entropy generation rate along with the aforementioned constraints. Minimal entropy generation seems intuitively correct since the double-pinch seems to result in smaller average temperature between the feed and bleed. However, as is evident from FIG. 2 (crossing of bleed lines) there is a tradeoff between extraction pressure and flowrate, so that proving the validity of entropy generation would not be a trivial task. In addition, minimizing for the entropy generation inside the cycle design is not practical since it would require a constrained optimization problem, embedded in the cycle simulation or optimization. For instance, the cycle optimization could set/select the heat transfer duty and the entropy generation would be minimized by varying the extraction pressure and flowrate subject to the MITA. Embedded optimization problems are extremely challenging and only recently have they been solved for nonconvex problems. See A. Mitsos, P. Lemonidis, P. I. Barton, Global solution of bilevel programs with a nonconvex inner program, Journal of Global Optimization 42 (4) (2008) 475-513, the entire contents of which are incorporated herein. In other words, minimizing entropy generation is deemed more complicated than the original system-level optimization problem. The double pinch approach, on the other hand, eliminates two degrees of freedom and satisfies the design constraints at each iteration performed by the optimizer while eliminating the need for a spatially distributed model. Finally, in the case of fixed heat transfer area, minimal entropy generation in the FWH is not a good criterion as discussed in the following.

Figure 8:
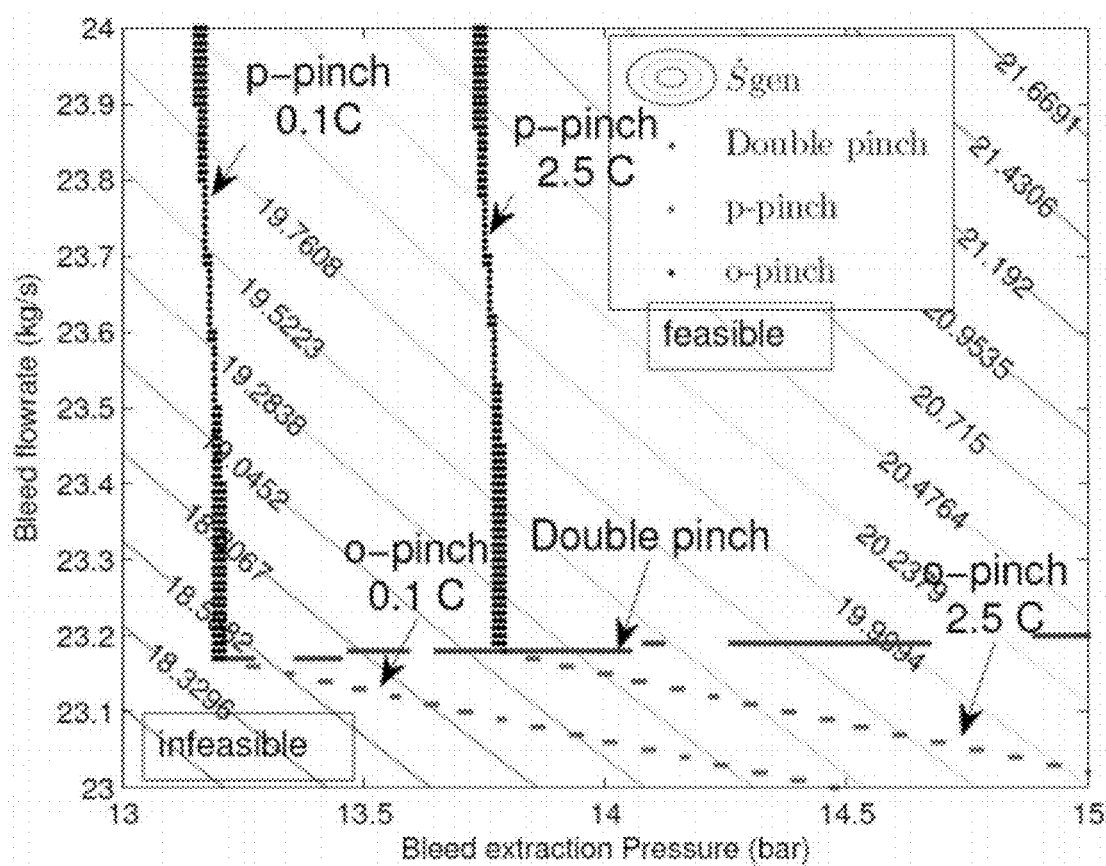
FIG. 8 is a map of entropy generation rate contours for the flowsheet of FIG. 6.

In FIG. 8, contours of entropy generation rate $\dot{S}_{gen}$ for regenerated duty $\dot{Q}_1=60.7$ MW for the flowsheet of FIG. 6 are shown. The pinch lines are super imposed: pinch at onset of condensation with a MITA of 0.1° C. and 2.5° C. (dashed lines labeled p-pinch); pinch at outlet of FWH with a MITA of 0.1° C. and 2.5° C. (dashed lines labeled o-pinch); double-pinch with variable MITA values (intersection of two pinch lines).

4.1.2 Fixed Area

The results presented in the previous subsection validate the analytical proof derived for the shortcut method of pinch analysis. This analysis in principle ignores capital costs associated with increasing the heat transfer area by reaching the MITA in two positions. To address capital costs, the flowsheet given in FIG. 6 is now analyzed for a given (constant) heat transfer area of FWH2, assumed equal to 2,516 m². To demonstrate the generality of the results, this area is selected different than the one corresponding to the selected heat transfer duty in the MITA. Similarly to the previous analysis, the bleed flowrate and pressure are discretized with 200 points each, in the range $P_{B1} \in [11,13]$ bar, $\dot{m}_{B1} \in [21,23]$ kg/s.

Figure 9:
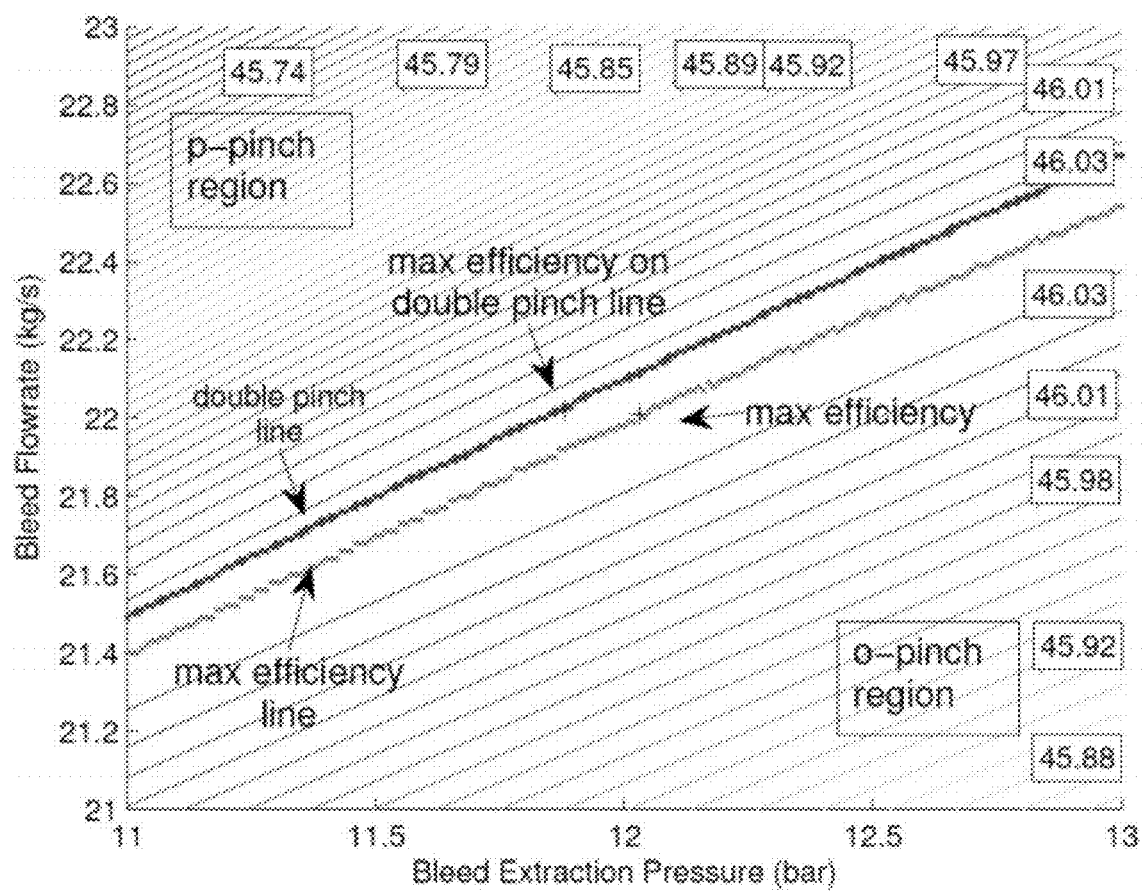
FIG. 9 is a map of efficiency contours for a fixed feedwater heater area.

This range is similar but not identical to before to account for a different heat transfer area/duty. The results are shown in FIG. 9, where the contours of efficiency are plotted. The efficiency is maximal for middle values of the extraction pressure and flowrate. For every extraction pressure there exists an extraction flowrate that maximizes cycle efficiency (line labeled "max efficiency line"); these pairs are near optimal. The difference is in the order of $10^{-5}$ ($10^{-3}$ percentage points), i.e., noticeable numerically but insignificant compared to model and/or numerical inaccuracies. In mathematical terms, there exists a linear manifold in the optimization variable space along which the directional derivative is very small. In practical terms, this allows the optimization of the cycle even if the pressure cannot be selected with arbitrary accuracy. This is for instance important for potential retrofit of existing cycles; therein it may not be possible to change the extraction pressure but only the extraction flowrate. The small difference in performance between the double-pinch pairs and the absolute optimum implies that retrofitting may get almost the same performance increase as optimal design.

For low extraction pressures and high extraction flowrates (upper left corner), the approach temperature at the onset of condensation is much smaller than the approach temperature at the outlet and the opposite is true for high extraction pressures and low extraction flowrates (lower right corner). FIG. 9 also shows the line of (approximate) double pinch (line labeled "double pinch line"), which results in an efficiency within $10^{-5}$ ($10^{-3}$ percentage points) of the aforementioned near-optimal efficiency line. The difference is so small that it could be attributed to model/numerical inaccuracies and is not significant from a practical perspective. It is also noteworthy that efficiency seems to favor large pinch at the outlet versus large pinch at the onset of condensation. This is a possible explanation for the current design practice of only slightly subcooling the drain, see the following discussion. However, both unbalanced approach temperatures are inferior to balanced MITA.

Figure 10:
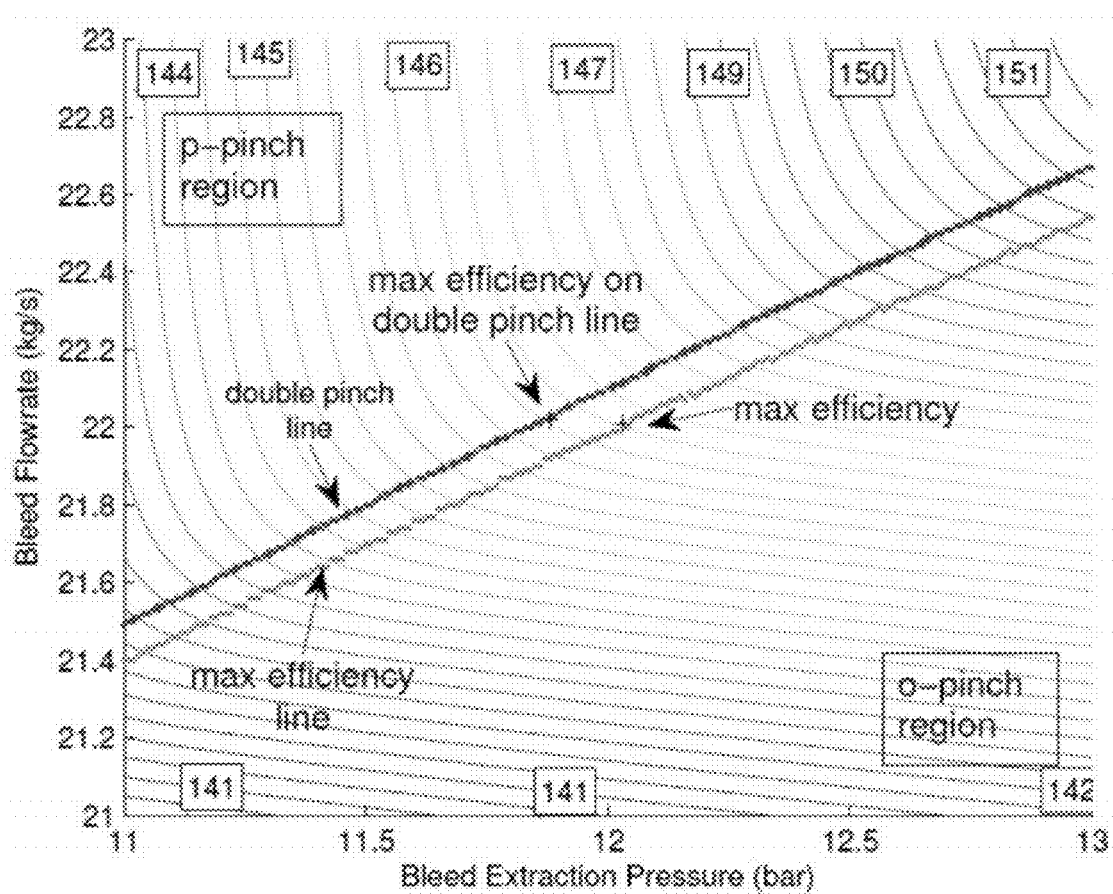
FIG. 10 is a map of entropy generation rate contours for a fixed feedwater heater area.

FIG. 10 plots contours of entropy generation rate in FWH2 as a function of the two bleed variables. The same lines as in FIG. 9 are superimposed on the figure. It is evident that minimal entropy generation in the FWH is not a good criterion for maximal cycle efficiency. This is in contrast to the case of pinch analysis for a given heat transfer duty. More concretely, minimal entropy generation occurs for low heat transfer duty, which occurs at low extraction pressure and flowrate. In other words, entropy generation minimization in the FWH ignores the benefits of increased regeneration prior to the boiler. In contrast, the double pinch criterion disclosed herein is a good criterion for optimal efficiency.

In FIG. 9, contours of efficiency for a fixed FWH Area 2,516 m³ are shown. The "max efficiency line" shows the optimal extraction flowrate for a given extraction pressure, while the "double pinch line" shows the pairs that result in double-pinch; operation points on the two lines give efficiency differences less than $10^{-5}$ ($10^{-3}$ percentage points). The "max efficiency on double pinch line" cross shows the optimal solution, while the "max efficiency" cross shows the best double-pinch point.

In FIG. 10, contours of entropy generation $\dot{S}_{gen}$ for a fixed FWH area 2,516 m³ are shown. The "max efficiency line" shows the optimal extraction flowrate for a given extraction pressure, while the "double pinch line" shows the pairs resulting in double-pinch; operation points on the two lines give efficiency differences less than $10^{-5}$ ($10^{-3}$ percentage points). The "max efficiency on double pinch line" cross shows the optimal solution, while the "max efficiency" cross shows the best double-pinch point.

4.2 Non-Cascading, Cascading, and Common Practice

High-efficiency regenerative Rankine cycles have cascading bleeds in a FWH train, i.e., combine the drain from a FWH with the inlet bleed of the preceding FWH (next lower pressure). In FIG. 6, the outlet from FWH1 is mixed with the inlet to FWH2 (line marked by x). The advantage of this arrangement is that the outlet bleed still has significantly higher temperature than the following deaerator or the condenser and thus the availability of the stream can be used to preheat the feedwater and thus reduce the required bleed flowrate to the preceding FWH. Typically, the cascading FWH are designed and operated to achieve the MITA in the onset of condensation and subcool the outlet bleed by a few K. This seemingly reduces the heat transfer area needed without loss in performance, since the bleed will be further used. However, this analysis may be misleading since further subcooling the bleed would imply that the preceding FWH needs to preheat the feed to a lower temperature.

No analytical proof for the optimality of cascading double pinch is given herein, but rather, the criterion is examined numerically for the flowsheet given in FIG. 6. Comparing the efficiency with the pinch analysis approach could be seen as unfairly favoring the proposed double-pinch criterion due to potentially larger heat transfer area. Consequently, the comparison is done for a constant total heat transfer area. The following four configurations/designs are compared: (i) cascading configuration with the proposed double-pinch criterion; (ii) noncascading configuration with the proposed double-pinch criterion; (iii) cascading configuration with the current design practice of slight subcooling at outlet for the FWH1 and the proposed double-pinch criterion for FWH2 (low pressure); (iv) cascading configuration with the current design practice of slight subcooling at outlet for both FWHs. For each case, a cycle-level optimization of the efficiency is performed by varying the fraction of heat transfer area between the two FWHs as well as the extraction pressures. For the double-pinch criterion, for a given pressure and heat transfer area, the FWH is fully specified, by (10). In the current design practice, for a given operating pressure the bleed outlet temperature is specified as $T^{sat}(P_B)-2K$; therefore, for a given heat transfer area the FWH is fully specified. A simple thought experiment to verify this is to note that the inlet temperature of the feed is fixed, and so is the inlet and the outlet temperature of the bleed; the feed flowrate is also given, so if we select the bleed flowrate we obtain the heat transfer duty and feed outlet temperature by energy balance; heat transfer correlations result in calculating the heat transfer area. In ASPENPLUS, the bleed flowrates and heat transfer duty for each FWH are implemented by design specifications embedded into the optimization.

The calculations are performed for heat transfer coefficients accounting for the different regimes, i.e., for the vapor-fluid section $U=0.709$ kW/(m$^2$K), for the condensation section $U=3.975$ kW/(m$^2$K), and subcooling section $U=1.704$ kW/(m$^2$K), as taken from an example in M. M. El-Wakil, Powerplant Technology, international Edition, McGraw-Hill, 1985, the entire contents of which are incorporated herein. The values of the heat transfer coefficients are actually dependent on the heater's geometry and flow conditions but here are taken as constant for simplicity. Additionally, calculations for a constant overall heat transfer coefficient are performed, but since these result in very similar qualitatively results, they are not shown for the sake of compactness.

Figure 11:
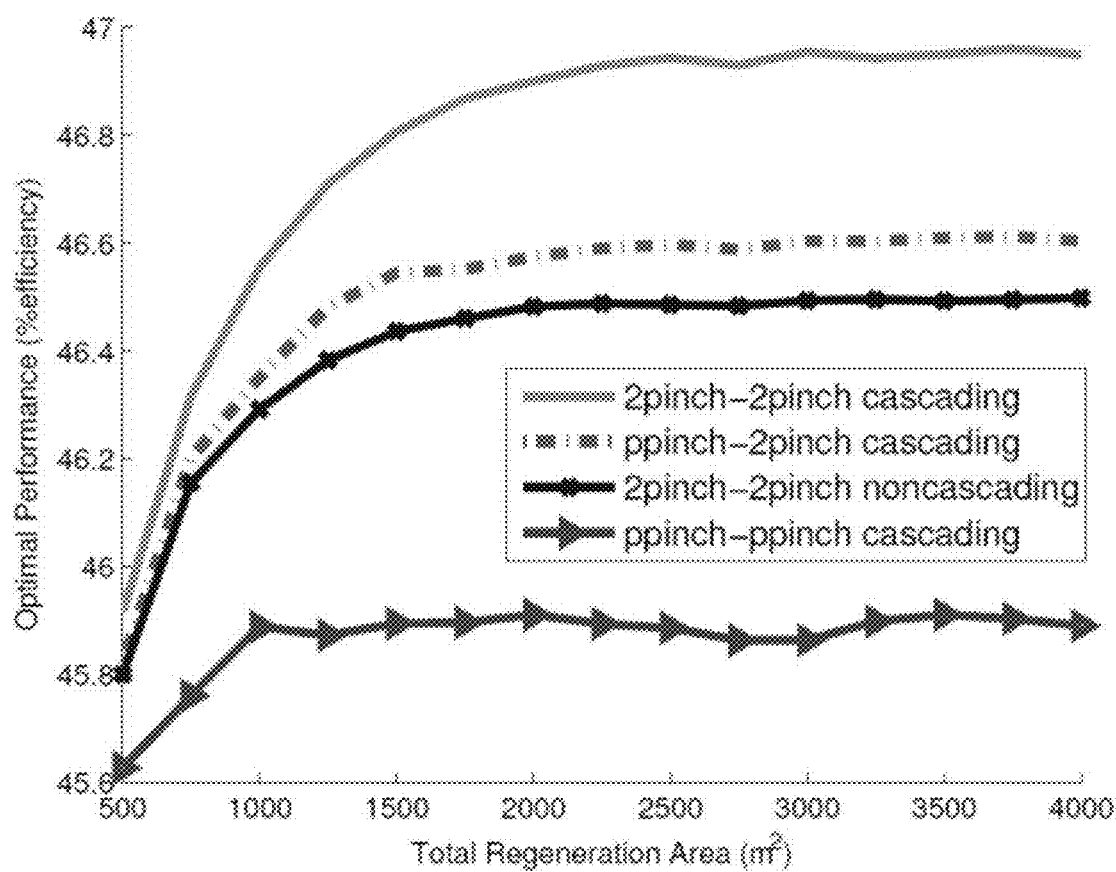
FIG. 11 is a plot of optimal performance of four different design procedures versus total feedwater heater area for the flowsheet of FIG. 6.

FIG. 11 plots the optimal efficiency for each of the four design procedures as a function of the total area of the FWHs. As expected, all four curves are monotonically increasing indicating the tradeoff of capital costs and efficiency, including the asymptote to a finite value for infinite heat transfer area. Moreover, as expected, the cascading flowsheet with double pinch outperforms the noncascading equivalent. The main finding is that the cascading cycle with double pinch in both feedwater heaters outperforms significantly the standard practice. For large values of the heat transfer area, the efficiency improvement is in the order of 2 percentage points compared to slight subcooling in both FWHs and in the order of 0.5 percentage points for the case that the double pinch criterion is applied to the low-pressure FWH and slight subcooling is applied to the high-pressure FWH. For small values of the heat transfer area, the efficiency improvements are not as dramatic but still substantial. Moreover, the noncascading cycle with a double pinch outperforms the cascading cycle without double pinches, and is very close to the cascading configuration with a double pinch in FWH2. Finally, the difference in performance among the different procedures increases with increasing area, or the design criterion disclosed herein becomes more important for large heat exchanger areas.

In FIG. 11, optimal performance of four different design procedures are plotted versus total FWHs area for the flowsheet of FIG. 6: cascading with double-pinch for both FWHs (solid curve, labeled "2pinch-2pinch cascading"); cascading with subcooling of 2K for FWH1 and double-pinch for FWH2 (dashed-dotted line, labeled "ppinch-2pinch cascading"); noncascading with double-pinch for both FWHs (line with x marks, labeled "2pinch-2pinch noncascading"); cascading with subcooling of 2K for both FWHs (line with triangle marks, labeled "ppinch-ppinch cascading").

5 Numerical Case Study With a Realistic Cycle Design

Figure 12:
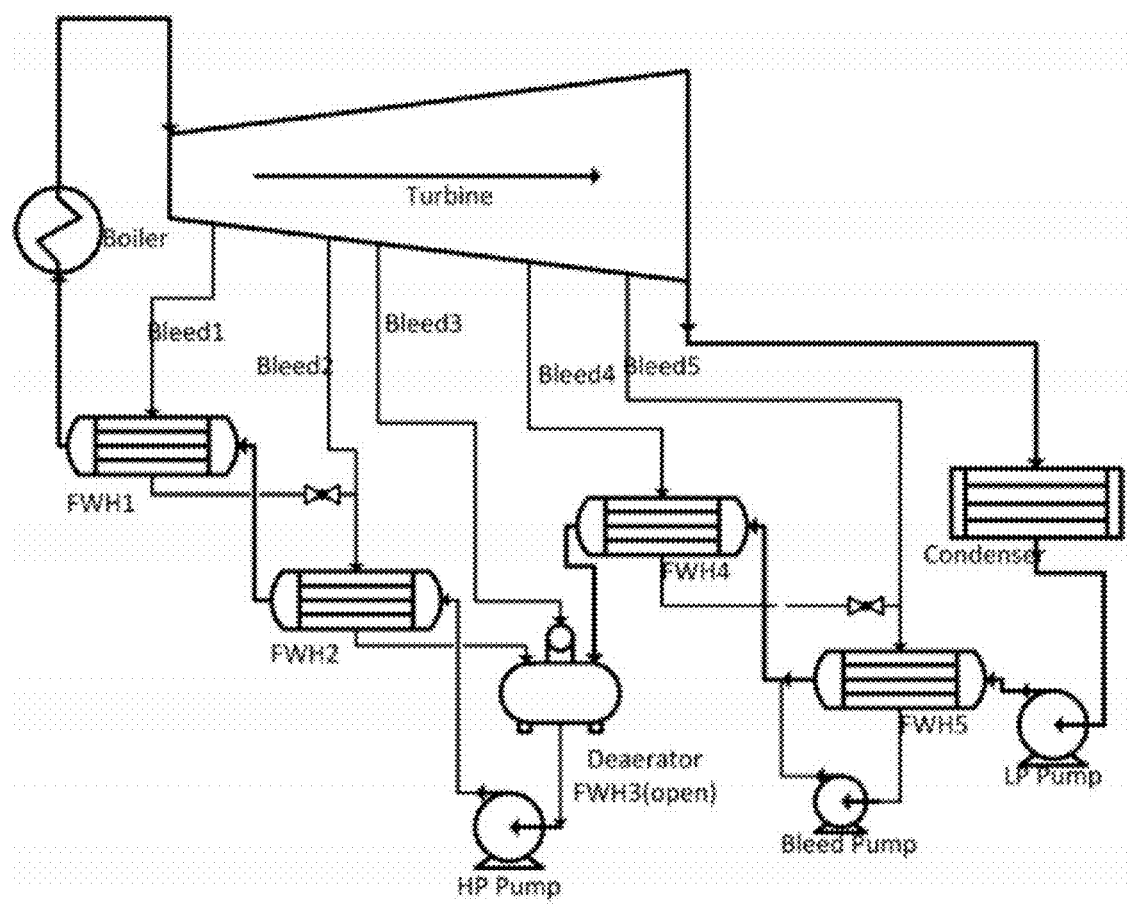
FIG. 12 is a schematic diagram of a power generation system that employs a regenerative Rankine cycle using four closed feedwater heaters.

In this section, a realistic Rankine cycle is considered, illustrated in FIG. 12. It contains four CFWHs and an OFWH acting as the deaerator. The four CFWHs are arranged in two pairs, above and below the deaerator. For each of the two pairs of CFWHs, cascading is used, i.e., the drain of the high temperature CFWH is combined with the bleed entering the CFWH. The drain of the lowest pressure is pumped upwards. The cycle specifications are shown in Table 1 below. For simplicity, the expansion line is considered to have a constant isentropic efficiency. Otherwise, the optimization is significantly complicated.

The proposed optimization criterion is compared with the current design practice of small subcooling in the drain. Initially, the bleeds are optimized following a MITA specification of 2K for each CFWH (FWH1,2,4&5) and with a subcooling of the drain of 2K. Then the area of each CFWH is fixed and used for optimization of the flowsheet with the double-pinch approach disclosed herein for three of the four CFWHs. Since the drain of the last CFWH is pumped upward, the double-pinch is not optimal and the drain is subcooled by 2K. Moreover, the bleed is two-phase liquid (not superheated) and thus a pinch occurs at the inlet of the bleed. The results are shown in Table 2; the criterion disclosed herein results in a significant efficiency increase, in the order of 0.45 percentage points. Note that this is achieved merely by changing the bleed pressures and flowrates, without any increase in heat transfer area, without addition of components, and without changing the flowsheet connectivity. Moreover, the area of each FWH is selected based on optimization of the conventional design criterion; allowing for a redistribution of the heat transfer area would result in further savings for the criterion disclosed herein.

TABLE 1

SPECIFICATIONS OF FLOWSHEET WITH
4 + 1 FWHS SHOWN IN FIG. 12

| Unit Name | Unit specifications |
|---|---|
| Feedwater main flowrate | 108 kg/s |
| Boiler pressure | 150.3 bar |
| Boiler superheat temperature | 542.9° C. |
| Turbine efficiency | Isentropic 0.7 - Mechanical 1 |
| Deaerator pressure = bleed3 pressure | 17.53 bar |
| Condenser pressure | 0.05 bar |

TABLE 1-continued

SPECIFICATIONS OF FLOWSHEET WITH
4 + 1 FWHS SHOWN IN FIG. 12

| | | |
|---|---|---|
| Condensate temperature | 33.0° C. | |
| Pumps Efficiency | Isentropic 1 - Mechanical 1 | |
| LP Pump discharge pressure | 20.31 bar | |

| Specification | Conventional | Double-pinch |
|---|---|---|
| FWH1 | MITA = 2° C. | Area = 2165 m$^2$ |
| FWH2 | MITA = 2° C. | Area = 1667.8 m$^2$ |
| FWH4 | MITA = 2° C. | Area = 1486.8 m$^2$ |
| FWH5 | MITA = 2° C. | Area = 1048 m$^2$ |

TABLE 2

RESULTS OF FLOWSHEET WITH
4 + 1 FWHS SHOWN IN FIG. 12

| Optimization results | Conventional | Double-pinch |
|---|---|---|
| Efficiency η | 38.11% | 38.56% |
| $P_B^{(1)}$ | 71.3 bar | 82.87 bar |
| $\dot{m}_B^{(1)}$ | 14.9 kg/s | 15.81 kg/s |
| $P_B^{(2)}$ | 36.0 bar | 35.21 bar |
| $\dot{m}_B^{(2)}$ | 6.26 kg/s | 6.736 kg/s |
| $\dot{m}_B^{(3)}$ | 6.221 kg/s | 8.418 kg/s |
| $P_B^{(4)}$ | 5.883 bar | 4.619 bar |
| $\dot{m}_B^{(4)}$ | 9.120 kg/s | 8.212 kg/s |
| $P_B^{(5)}$ | 1.080 bar | 0.7478 bar |
| $\dot{m}_B^{(5)}$ | 7.162 kg/s | 6.621 kg/s |

6 Summary

A new design criterion is disclosed above for the design and operation of feedwater heaters in regenerative Rankine cycles. The basis is to have the same pinch in the onset of condensation of the bleed and in the outlet of the bleed. The criterion is proved analytically for a simple configuration and illustrated numerically in case studies for various configurations, see Table 3 below. Application of the criterion results in significant efficiency improvements for a constant heat transfer area (representing capital costs). Moreover, a procedure is disclosed herein that drastically simplifies the design and optimization of regenerative Rankine cycles. In the pinch analysis, for each feedwater heater, the pinch value and extraction pressure (design variable) are fixed or optimized for; the bleed flowrate and heat transfer rate (operational variables) are adjusted to achieve the double pinch. In the rigorous calculation, the extraction pressure and heat transfer area (design variables) are fixed or optimized for; the bleed flowrate and pinch value are adjusted to achieve the double pinch. The case studies demonstrate that under the proposed double-pinch criterion, the cycle performance is not very sensitive to the design and substantial improvements to performance can be achieved by adjusting only the operational variables. If local solvers are used for the optimization, the criterion increases the chances to find a global optimum; if global solvers are used the number of variables and constraints is reduced which typically results in significantly faster CPU times. Regenerative Rankine cycles are very common in industry and novel energy systems and thus the criterion disclosed herein has important implications for research and development.

The double pinch criterion can be applied to different systems, such as boilers and heat recovery steam generators, and cases where both streams exhibit phase change. The double pinch criterion can also be used when splitting the drain and in both cascading and non-cascading ways.

TABLE 3

THE APPLICABILITY OF THE PROPOSED DESIGN
CRITERION FOR VARIOUS CONFIGURATIONS AND
THE EVIDENCE GIVEN IN THIS DISCLOSURE

| | Pinch analysis with fixed $\dot{Q}$, and MITA | Fixed heat transfer area |
|---|---|---|
| Drain to condenser | double pinch unique optimum (analytical proof + numerical case studies) | double pinch unique optimum (numerical case studies) |
| Drain to OFWH | double pinch unique optimum (numerical case studies) | double pinch unique optimum (numerical case studies) |
| Cascading drain to CFWH | double pinch unique optimum (numerical case studies) | double pinch unique optimum (numerical case studies) |
| Pumping backward/forward (downwards/upwards) | double pinch non-unique optimum (analytical proof) | double pinch not optimal (analytical proof) |
| OFWH | double pinch not applicable; optimal extraction pressure equals to operating pressure (analytical proof) | double pinch not applicable; optimal extraction pressure equals to operating pressure (analytical proof) |

The approach detailed above describes a novel operation of feedwater heaters which results in the optimum operation of Rankine cycles. For new plants, the operation can be easily implemented, and the operation is also applicable to already-operational plants. Moreover, a method of computation is disclosed above that provides benefits to simulation and optimization power plant modeling software while eliminating errors and failures, speeding convergence, reducing time and memory requirements, reducing problem complexity by reducing the number of optimization variables and actively satisfying constraints, and avoiding suboptimal local optimum operating conditions. This can also be embodied by less favorable procedures requiring discretization of heat exchanges and/or iterations to satisfy the proposed criterion. Significant improvements, in the order of 0.4% (4 percentage points) are achieved by using different extraction pressures and flow rates of the bleeds compared to the common practice. The total worldwide electricity consumption in 2008 was 132,000 TWh, 105,600 TWh (80%) of which was produced by Rankine power cycles. Considering a 10 cent/kWh (an average pricing in the United States), results in around $11 trillion selling price worldwide. Even an improvement of 0.01% in the operation of the Rankine cycle can therefore result in $1 billion dollars in annual savings (considering a 0.4% improvement results in around $40 billion in annual savings). The above analysis attributes all electricity cost to the fuel; this is not exact, but since the fuel is a significant component, the savings are of the same order of magnitude, in the order of billions of dollars.

The operation disclosed herein is based on a double-pinch criterion for closed feedwater heaters, Bleeds are extracted from the turbine as superheated vapor or two-phase fluid and exit the closed feedwater heaters as a subcooled liquid; the feed water on the other hand can always be a subcooled liquid. The feed water heaters can be modeled as counter-current heat exchangers and thus there are two positions in the feedwater heater that could lead to a pinch, namely i) at the exit of the bleed and ii) at the onset of condensation. For a given heat duty in the feedwater heater, feed inlet temperature and flowrate, the extraction flow rate and pressure can be chosen to achieve the same minimal approach temperature at the two potential pinch points. This result is analytically proven for shortcut design using a prespecified minimal approach temperature based on weak assumptions on the physical properties of the working fluid and on the performance of the expansion line. The criterion is numerically demonstrated for the shortcut design and for design using a prespecified heat exchanger area. Imposing the double pinch is easy inside an optimization procedure, as well as combined with the well-known criterion of same enthalpy rise across feed water heaters. For the case of optimization, the pressure is taken as the optimization variable analytically calculating heat duty and mass flowrate. The change of independent variable results in significantly faster computational performance without introducing spurious local minima. The criterion is applicable to closed feedwater heaters in the following configurations:

Non-Cascading Bleeds: where the bleed at the exit of a certain feedwater heater proceeds directly to the deaerator or the condenser.

Cascading Bleeds: where the bleed at the exit of a certain feedwater heater mixes with the bleed of the consecutive lower pressure feedwater heater before entering the latter.

Each bleed at the exit of its respective feed water heater can be pumped and combined to the feedwater prior to its entry to the feedwater heater. From a minimum internal temperature approach specification, efficiency is independent of the degree of subcooling and double pinch is a proper design criterion. However, to save on heat exchanger area, the bleed can be taken out of the feedwater heater at a couple of degrees subcooled.

For the configuration where the bleed at the exit of the feedwater heater is pumped and mixed with the feed water at the heater outlet, the operation can be optimal when the mixing is isothermal. In other words, the pumped bleed temperature is equal to the feed water temperature as it exits the feed water heater and thus a few degrees below the bleed's original saturation temperature prior to pumping. Therefore, the bleed (or cascading bleed stream) is generally a few degrees subcooled as it exits the feedwater heater for such a configuration.

The criterion disclosed herein can be beneficial for more than just regeneration in a Rankine cycle. For example, it can have significant contribution to heat exchange and integration where the working fluids are not identical or not pure substances, e.g., flue gas and working fluid of a Rankine cycle in heat recovery steam generation (HRSG), the HRSG of a bottoming Rankine cycle, and the HRSG where multiple pressure levels of the Rankine cycle's working fluid are used etc. Chemical plants and processes can also benefit from this heat integration process.

In general, the problem with existing techniques of optimizing a regenerative Rankine cycle is the presence of three variables per regenerative bleed, i—bleed extraction pressure ii—bleed flowrate iii—duty transferred from bleed to feed in the feedwater heater, and a non-convex objective function for the set of variables. The conventional practice is suboptimal, whether from the analytical proof or the numerical results presented. This causes an inefficient operation and significant losses. In the disclosed scheme, two of the three variables can be eliminated, greatly simplifying the optimization problem while enhancing the performance. Another advantage is that the duty transfer and the bleed flowrate are explicit in terms of the extraction pressure, eliminating the need for an expensive spatially distributed model further simplifying the optimization problem.

$$\dot{m}_B = \dot{m}_F \frac{h^{g,sat}(P_B) - h^l(T_{F,i} + \Delta_{MITA}T, P_B)}{h^l(T^{sat}(P_B) - \Delta_{MITA}T, P_F) - h^l(T_{F,i}, P_F)}$$

$$\dot{Q} = \dot{m}_B(h_T(P_B) - h(T_{F,i} + \Delta_{MITA}T, P_B))$$

In some cases, it may not be possible to exactly select the extraction pressure. This is for instance the case in the retrofit of existing units, or if there are technical difficulties (e.g., extraction only allowed between stages). As noted above, however, even if the extraction pressure cannot be precisely optimized, the extraction mass flowrate that gives the double pinch can result in near-optimal performance. This near-optimal performance is significantly better than the performance achieved with current design practice.

The disclosed operation can be used by any utility operating regenerative Rankine cycles, and its derivatives like Kalina cycles or organic Rankine cycles, as well as in the design and construction of power plants. In some embodiments, the disclosed criterion can lead to immediate increase in efficiency with no additional capital cost. The cost savings due to this efficiency increase can be major, in the order of at least billions of US dollars annually. Moreover, the disclosed criterion can be used in chemical plants that rely on heat regeneration and integration.

The disclosed criterion and optimization methodologies can also be used in simulation software to determine the optimum operation parameters for a power plant or other system in which a Rankine cycle is used. The criterion can allow for the design of the plant be optimized, while the optimization methodologies can provide an error free and failure proof convergence to the optimum solution.

Figure 13:
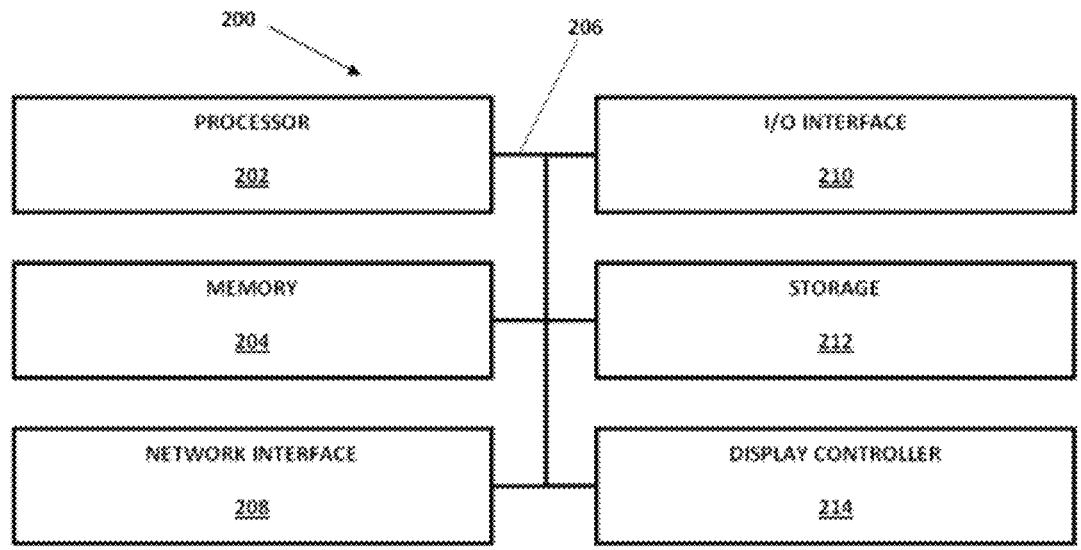
FIG. 13 is a schematic diagram of a computer system architecture.

The methodologies, optimizations, and computations disclosed herein can be executed using one or more computer systems. FIG. 13 illustrates an exemplary architecture of a computer system 200. Although an exemplary computer system 200 is depicted and described herein, it will be appreciated that this is for sake of generality and convenience. In other embodiments, the computer system may differ in architecture and operation from that shown and described here.

The illustrated computer system 200 includes a processor 202 which controls the operation of the computer system 200, for example by executing an operating system (OS), device drivers, application programs, and so forth. The processor 202 can include any type of microprocessor or central processing unit (CPU), including programmable general-purpose or special-purpose microprocessors and/or any of a variety of proprietary or commercially-available single or multi-processor systems. The computer system 200 also includes a memory 204, which provides temporary or permanent storage for code to be executed by the processor 202 or for data that is processed by the processor 202. The memory 204 can include read-only memory (ROM), flash memory, one or more varieties of random access memory (RAM), and/or a combination of memory technologies. The various elements of the computer system 200 are coupled to a bus system 206. The illustrated bus system 206 is an abstraction that represents any one or more separate physical busses, communication lines/interfaces, and/or multi-drop or point-to-point connections, connected by appropriate bridges, adapters, and/or controllers.

The computer system 200 also includes a network interface 208, an input/output (I/O) interface 210, a storage device 212, and a display controller 214. The network interface 208 enables the computer system 200 to communicate with remote devices (e.g., other computer systems) over a network. The I/O interface 210 facilitates communication between one or more input devices, one or more output devices, and the various other components of the computer system 200. The storage device 212 can include any conventional medium for storing data in a non-volatile and/or non-transient manner. The storage device 212 can thus hold data and/or instructions in a persistent state (i.e., the value is retained despite interruption of power to the computer system 200). The storage device 212 can include one or more hard disk drives, flash drives, USB drives, optical drives, various media disks or cards, and/or any combination thereof and can be directly connected to the other components of the computer system 200 or remotely connected thereto, such as over a network. The display controller 214 includes a video processor and a video memory, and generates images to be displayed on one or more displays in accordance with instructions received from the processor 202.

The various functions performed by the computer system can be logically described as being performed by one or more modules. It will be appreciated that such modules can be implemented in hardware, software, or a combination thereof. It will further be appreciated that, when implemented in software, modules can be part of a single program or one or more separate programs, and can be implemented in a variety of contexts (e.g., as part of an operating system, a device driver, a standalone application, and/or combinations thereof). In addition, software embodying one or more modules can be stored as an executable program on one or more non-transitory computer-readable storage mediums. Functions disclosed herein as being performed by a particular module can also be performed by any other module or combination of modules, and the computer system can include fewer or more modules than what is shown and described herein.

In some embodiments, the computer system can include an input module configured to receive one or more power generation system design or operating parameters. Exemplary input parameters can include a flow rate of a main stream through the turbine, a steam generator temperature, a steam generator pressure, and a condenser operating pressure. The input module can be further configured to store received input parameters in a memory. The input parameters to the computer system can be the desired operating criteria of the powerplant or model of the power plant, rather than the instantaneous values. This can reduce convergence time and does not require as much sensing and information extraction from the cycle or its model.

The computer system can also include an optimization module configured to calculate at least one of a bleed pressure, a bleed flow rate, and a heat exchanger area for a feedwater heater used in a power generation system based on input parameters received by the input module and the methodologies disclosed above. The bleed pressure, bleed flow rate, and/or heat exchanger area can thus be calculated by the optimization module to produce a double pinch in the feedwater heater.

The computer system can also include an output module configured to display or otherwise present calculated results to a user. The output module can also be configured to control the operation of the power generation system, such that the computer system can automatically adjust various operating parameters such as bleed pressure and bleed flow rate to configure the power generation system so as to achieve the values calculated by the optimization module.

Figure 14:
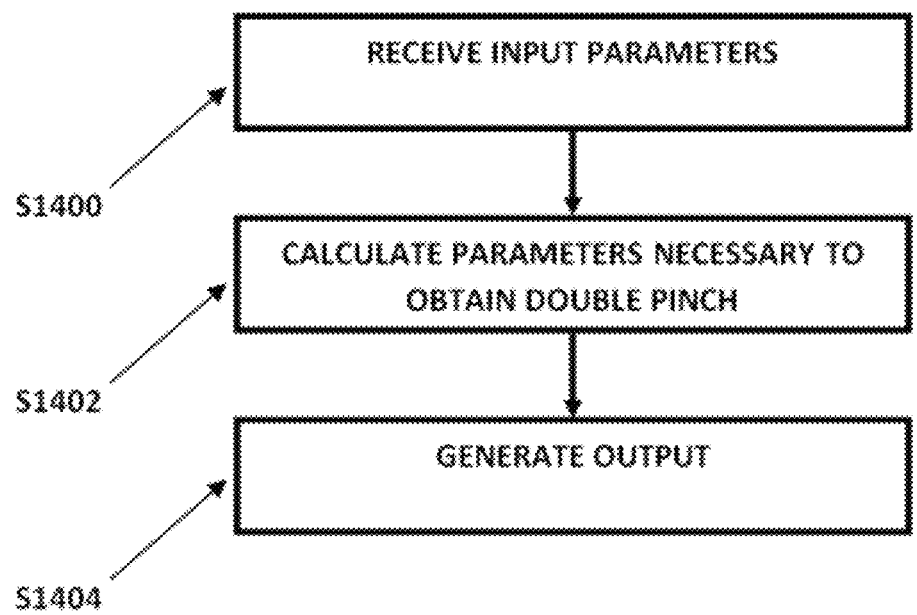
FIG. 14 is a flowchart of a method of designing or optimizing a Rankine cycle using a double pinch criterion.

An exemplary method of designing or optimizing a power generation system is shown in the flowchart of FIG. 14. While various methods disclosed herein may be shown in relation to a flowchart or flowcharts, it should be noted that any ordering of method steps implied by such flowcharts or the description thereof is not to be construed as limiting the method to performing the steps in that order. Rather, the various steps of each of the methods disclosed herein can be performed in any of a variety of sequences. In addition, as the illustrated flowchart(s) are merely exemplary embodiments, various other methods that include additional steps or include fewer steps than illustrated are also within the scope of the present invention.

The illustrated method, which in some embodiments can be executed by a computer system, begins at step S1400 where one or more power generation system input parameters are received. As noted above, exemplary input parameters can include a flow rate of a main stream through the turbine, a steam generator temperature, a steam generator pressure, and a condenser operating pressure. Execution can then proceed to step S1402, in which at least one of a bleed pressure, a bleed flow rate, and a heat exchanger area is calculated for a feedwater heater used in a power generation system, based on the input parameters received in step S1400 and the methodologies disclosed above. The bleed pressure, bleed flow rate, and/or heat exchanger area can thus be calculated in step S1402 to produce a double pinch in the feedwater heater. Execution can then proceed to step S1404, where an output from the optimization of step S1402 is produced. The output can include a display or other presentation of calculated results to a user. These results can be used to design a power generation system to achieve a double pinch in a feedwater heater, or to manually adjust an existing power generation system to achieve a double pinch in a feedwater heater. The output can also include control signals that actuate one or more valves, controllers, or other components of an existing power generation system so as to automatically cause the power generation system to operate with a double pinch in a feedwater heater. Accordingly, using the illustrated method, the design or operation of a power generation system can be optimized using the double pinch criterion disclosed herein.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method of operating a power generation system, comprising:
   heating a working fluid in a steam generator;
   directing the heated working fluid into a turbine to rotate the turbine, the working fluid forming a feed after exiting the turbine;
   extracting a bleed from the turbine and using the bleed to heat the feed in a feedwater heater configured to exchange heat between a first flow path through which the feed flows and a second flow path through which the bleed flows; and
   adjusting at least one of a mass flow rate of the bleed and an extraction pressure of the bleed such that a double pinch is obtained in the feedwater heater, the double pinch comprising a first pinch point at an onset of condensation of the bleed and a second pinch point at a bleed outlet of the feedwater heater.

2. The method of claim 1, further comprising heating the feed in the steam generator after it exits the feedwater heater.

3. The method of claim 1, wherein the feed is formed by condensing the working fluid in a condenser after the working fluid exits the turbine.

4. The method of claim 1, wherein the steam generator is a supercritical steam generator and the heated working fluid is in a supercritical state.

5. The method of claim 1, wherein the steam generator is a subcritical boiler and the heated working fluid is a superheated vapor.

6. The method of claim 1, wherein a minimal approach temperature at the first pinch point is approximately equal to a minimal approach temperature at the second pinch point.

7. The method of claim 1, wherein the extraction pressure of the bleed ($P_B$) and the mass flow rate of the bleed ($\dot{m}_B$) selected for a given feedwater heater heat duty transfer ($\dot{Q}$) are approximated by:

$$\dot{m}_B = \dot{m}_F \frac{h^{g,sat}(P_B) - h^l(T_{F,i} + \Delta_{MITA}T, P_B)}{h^l(T^{sat}(P_B) - \Delta_{MITA}T, P_F) - h^l(T_{F,i}, P_F)}$$

and $$\dot{Q} = \dot{m}_B(h_T(P_B) - h^l(T_{F,i} + \Delta_{MITA}T, P_B)).$$

8. The method of claim 1, wherein the smallest extraction pressure that allows for a pinch at the bleed outlet of the feedwater heater is selected as the extraction pressure of the bleed.

9. The method of claim 1, wherein the smallest mass flow rate that allows for a pinch at the onset of condensation of the bleed is selected as the mass flow rate of the bleed.

10. The method of claim 1, wherein adjusting the mass flow rate of the bleed comprises opening or closing a valve.

11. The method of claim 1, wherein adjusting the extraction pressure of the bleed comprises adjusting a valve network to select a location in the turbine from which the bleed is extracted.

12. The method of claim 11, wherein the turbine comprises a plurality of turbine stages and the valve network is configured to select from which of the plurality of stages the bleed is extracted.

13. The method of claim 1, further comprising, during transient modes of power plant operation, adjusting at least one of the mass flow rate of the bleed and the extraction pressure of the bleed such that the double pinch is obtained in the feedwater heater.

14. The method of claim 13, wherein said transient modes include power plant startup.

\* \* \* \* \*